US012701881B2

(12) United States Patent
Cho et al.

(10) Patent No.: US 12,701,881 B2
(45) Date of Patent: Aug. 4, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Jae Hyung Cho, Yongin-si (KR); Dong Hoon Lee, Yongin-si (KR); Jae Yong Jang, Yongin-si (KR); Min Jae Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/172,889

(22) Filed: Apr. 8, 2025

(65) Prior Publication Data

US 2026/0040781 A1 Feb. 5, 2026

(51) Int. Cl.
| | |
|---|---|
| *H10K 59/124* | (2023.01) |
| *G09G 3/3258* | (2016.01) |
| *G09G 3/3266* | (2016.01) |
| *H10K 59/131* | (2023.01) |

(52) U.S. Cl.
CPC ......... *H10K 59/131* (2023.02); *G09G 3/3258* (2013.01); *G09G 3/3266* (2013.01); *H10K 59/124* (2023.02); *G09G 2300/0426* (2013.01); *G09G 2300/0819* (2013.01); *G09G 2300/0852* (2013.01); *G09G 2310/0286* (2013.01); *G09G 2320/043* (2013.01)

(58) Field of Classification Search
CPC .............. G09G 3/3258; G09G 3/3266; G09G 2300/0426; G09G 2300/0819; G09G 2300/0852; G09G 2310/0286; G09G 2320/043; H10K 59/124; H10K 59/131
See application file for complete search history.

(56) References Cited

U.S. PATENT DOCUMENTS

| | | | | |
|---|---|---|---|---|
| 2012/0076256 A1* | 3/2012 | Yonemaru | .............. | G11C 19/28 |
| | | | | 377/79 |
| 2013/0044854 A1* | 2/2013 | Yonemaru | ............ | G11C 19/184 |
| | | | | 377/64 |
| 2019/0279589 A1* | 9/2019 | Kusumi | .............. | G09G 3/3677 |
| 2020/0020410 A1* | 1/2020 | Du | ......................... | G11C 19/28 |

(Continued)

FOREIGN PATENT DOCUMENTS

| | | |
|---|---|---|
| CN | 115702611 A | 2/2023 |
| KR | 10-2021-0065245 A | 6/2021 |
| KR | 10-2023-0096748 A | 6/2023 |

*Primary Examiner* — Ryan A Lubit
(74) *Attorney, Agent, or Firm* — F. CHAU & ASSOCIATES, LLC

(57) ABSTRACT

A display device include a substrate comprising a display area having emission areas and a non-display area arranged around the display area, a circuit layer disposed on the substrate, light emitting elements disposed in the emission areas and disposed on the circuit layer, wherein the circuit layer comprises a light emitting pixel driver electrically connected to one of the light emitting elements, a set of gate lines connected to the light emitting pixel driver, and a gate driver supplying a set of gate signals to the set of gate lines, and wherein the gate driver comprises a first signal driver electrically connected to one of the set of gate lines, and first through holes disposed in the circuit layer, wherein the first through holes, when viewed in a plan view, are adjacent to one side of a first region where the first signal driver is disposed.

20 Claims, 24 Drawing Sheets

(56)          References Cited

U.S. PATENT DOCUMENTS

| | | | |
|---|---|---|---|
| 2021/0159278 A1* | 5/2021 | Lee | H10W 90/00 |
| 2021/0183984 A1* | 6/2021 | Park | H10K 59/124 |
| 2023/0005997 A1* | 1/2023 | Lee | H10W 90/00 |
| 2023/0200128 A1* | 6/2023 | Su | H10K 59/122 |
| | | | 257/40 |
| 2023/0215344 A1* | 7/2023 | Kim | G09G 3/32 |
| | | | 345/205 |
| 2024/0249687 A1* | 7/2024 | Lu | G09G 3/3275 |
| 2024/0315105 A1* | 9/2024 | Park | H10K 59/131 |
| 2025/0029557 A1* | 1/2025 | Li | G09G 3/32 |
| 2025/0104645 A1* | 3/2025 | Xu | G09G 3/3266 |
| 2025/0111828 A1* | 4/2025 | Wang | G09G 3/20 |

* cited by examiner

GL: GWL, GCL, GIL, ECL, GBL

GL: GWL, GCL, GIL, ECL, GBL

SEL1: CH1, E11, E21, CH2, E12, E22, CH6, E16, E26
GCDL1: G1, G2, G6
GCDL2: CAE, LB2
SEL2: CH4, E14, E24
GCDL3: G4
SDCDL1: ANCE1, DCE, GCNE
SDCDL2: ANCE2, DL, VDL

120: EPD, GL, GTDR
GTDR: ST
ST: GWST, GBST, ECST

DR3

SEL1: ADE
SDCDL1: PSPLL1
SDCDL2: PSPLL2

DR3

SEL1: ADE
SDCDL2: VGLL3

DISPLAY DEVICE AND ELECTRONIC DEVICE INCLUDING THE SAME

CROSS-REFERENCE TO RELATED APPLICATION

This application claims priority from Korean Patent Application No. 10-2024-0103766 filed on Aug. 5, 2024 in the Korean Intellectual Property Office and from Korean Patent Application No. 10-2024-0149630 filed on Oct. 29, 2024 in the Korean Intellectual Property Office, and all the benefits accruing therefrom under 35 U.S.C. 119, the contents of each of which in its entirety are herein incorporated by reference.

BACKGROUND

1. Technical Field

The present disclosure relates to a display device and an electronic device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device and a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using light emitting elements, each including a light emitting layer made of an organic light emitting material. As described above, the organic light emitting display device implements image display using a self-light emitting element, and thus may have relatively superior performance in power consumption, response speed, luminous efficiency, luminance, and wide viewing angle compared to other display devices.

In the display device, a display surface from which light is emitted may include a display area in which an image is displayed, and a non-display area around the display area. Emission areas emitting light with respective luminance and colors may be arranged in the display area.

SUMMARY

The display device may include light emitting pixel drivers that transmit a driving current for the light emitting elements, gate lines electrically connected to at least one gate electrode among the transistors of each of the light emitting pixel drivers, and a gate driver that includes stages electrically connected to the gate lines.

The gate driver may be a circuit that sequentially outputs a gate signal to the gate lines, and may be implemented in a relatively simple manner. Accordingly, the gate driver may be provided as a part of a circuit layer together with the light emitting pixel drivers.

Meanwhile, each of the stages may include two or more transistors, and each of the transistors may include a channel portion made of a semiconductor material.

However, if hydrogen (H) introduced during the stacking process of conductive or insulating materials partially remains, the semiconductor properties of the semiconductor material contained in the channel portion of some transistors may vary in response to the hydrogen (H). As a result, the threshold voltage of some transistors may vary, causing differences in the output characteristics of the stages, which may lead to a degradation in the display quality and lifespan of the display device.

In view of the foregoing, aspects of the present disclosure provide a display device and an electronic device including the same, in which the residual amount of hydrogen introduced may be reduced relatively uniformly, thereby improving display quality and lifespan.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, a display device include a substrate comprising a display area in which a plurality of emission areas are arranged and a non-display area arranged around the display area, a circuit layer disposed on the substrate, a plurality of light emitting elements disposed in the plurality of emission areas and disposed on the circuit layer, wherein the circuit layer comprises a light emitting pixel driver electrically connected to one of the plurality of light emitting elements, a set of gate lines connected to the light emitting pixel driver, and a gate driver supplying a set of gate signals to the set of gate lines, and wherein the gate driver comprises a first signal driver electrically connected to one of the set of gate lines, and a plurality of first through holes disposed in the circuit layer, wherein the plurality of first through holes, when viewed in a plan view, are adjacent to one side of a first region where the first signal driver is disposed.

The display device further discloses a plurality of second through holes disposed in the circuit layer. The plurality of second through holes, when viewed in the plan view, are adjacent to a boundary between the first region where the first signal driver is disposed and a second region where a second signal driver is disposed. The gate driver further comprises the second signal driver electrically connected to another gate line of the set of gate lines. The first region and the second region are arranged in an extension direction of the set of gate lines.

At least some of the plurality of first through holes and the plurality of second through holes exposes etching blocking patterns that are disposed in island shapes.

The circuit layer further comprises a power supply line disposed in the non-display area. A portion of the power supply line fills at least some of the plurality of first through holes.

The power supply line transmits one of a first power and a second power for generating a driving current transmitted to the light emitting elements.

At least a part of the second signal driver is symmetrical to the first signal driver with respect to the boundary between the first region and the second region. The gate driver comprises at least one shared line disposed adjacent to the boundary between the first region and the second region and electrically connected to the first signal driver and the second signal driver. The at least one shared line overlaps at least a part of the plurality of second through holes.

The circuit layer comprises a first semiconductor layer disposed on the substrate; a first gate insulating layer covering the first semiconductor layer; a first gate conductive layer disposed on the first gate insulating layer; a second gate insulating layer covering the first gate conductive layer; a second gate conductive layer disposed on the second gate insulating layer; a first interlayer insulating layer covering the second gate conductive layer; a second semiconductor layer disposed on the first interlayer insulating layer; a third gate insulating layer covering the second semiconductor layer; a third gate conductive layer disposed on the third gate insulating layer; and a second interlayer insulating layer covering the third gate conductive layer. The second interlayer insulating layer, the third gate insulating layer, the first interlayer insulating layer, the second gate insulating layer and the first gate insulating layer each contain an inorganic insulating material. The first through holes and the second through holes each penetrate the second interlayer insulating layer, the third gate insulating layer, the first interlayer insulating layer, the second gate insulating layer and the first gate insulating layer.

The circuit layer further comprises a first source-drain conductive layer disposed on the second interlayer insulating layer; a first planarization layer covering the first source-drain conductive layer; a second source-drain conductive layer disposed on the first planarization layer; and a second planarization layer covering the second source-drain conductive layer. The power supply line is disposed in the first source-drain conductive layer or the second source-drain conductive layer.

The at least one shared line is disposed in the first source-drain conductive layer or the second source-drain conductive layer.

Each of the first signal driver and the second signal driver is electrically connected to a first gate level voltage line transmitting a first gate level voltage, a second gate level voltage line transmitting a second gate level voltage different from the first gate level voltage, and a third gate level voltage line transmitting a third gate level voltage different from the first and second gate level voltages. Each of the first signal driver and the second signal driver comprises a first stage transistor electrically connected between a sequence transmission line transmitting a stage sequence signal and a first node and turned on in response to a gate clock signal; a second stage transistor electrically connected between the first node and a second node and turned on in response to the second gate level voltage; a third stage transistor electrically connected between the second gate level voltage line and a third node and turned on in response to a potential (i.e., a voltage) of the second node; a first stage capacitor electrically connected between the second node and an output node; a fourth stage transistor electrically connected between the first gate level voltage line and the third node and turned on in response to a potential of the first node; a second stage capacitor electrically connected between the first gate level voltage line and the third node; a fifth stage transistor electrically connected between the second gate level voltage line and the output node and turned on in response to the potential of the second node; a sixth stage transistor electrically connected between the first gate level voltage line and the output node and turned on in response to a potential of the third node; a seventh stage transistor electrically connected between the third gate level voltage line and a fourth node and turned on in response to the potential of the second node; and an eighth stage transistor electrically connected between the first gate level voltage line and the fourth node and turned on in response to the potential of the third node. The at least one shared line comprises the third gate level voltage line.

The at least one shared line further comprises a stage sequence transmission line transmitting the stage sequence signal.

The set of gate lines includes a scan write line transmitting a scan write signal, a scan initialization line transmitting a scan initialization signal, a gate control line transmitting a gate control signal, an emission control line transmitting an emission control signal, and a bias control line transmitting a bias control signal. The gate driver comprises a scan write signal driver electrically connected to the scan write line, a scan initialization signal driver electrically connected to the scan initialization line, a gate control signal driver electrically connected to the gate control line, an emission control signal driver electrically connected to the emission control line, and a bias control signal driver electrically connected to the bias control line. The first signal driver is one of the scan initialization signal driver, the gate control signal driver, the emission control signal driver, and the bias control signal driver. The second signal driver is another one of the scan initialization signal driver, the gate control signal driver, the emission control signal driver, and the bias control signal driver.

The scan write signal driver is adjacent to one side of the display area, wherein the emission control signal driver is adjacent to the power supply line. The bias control signal driver is disposed between the scan write signal driver and the emission control signal driver. The first signal driver is the emission control signal driver, and the second signal driver is the bias control signal driver.

The scan write signal driver is adjacent to one side of the display area. The scan initialization signal driver is adjacent to the power supply line. The gate control signal driver is disposed between the scan write signal driver and the scan initialization signal driver. The first signal driver is the scan initialization signal driver. The second signal driver is the gate control signal driver.

The light emitting pixel driver includes a first transistor electrically connected between a first node and a second node, wherein the first transistor turns on in response to a voltage of a third node, a pixel capacitor electrically connected between the power supply line and the third node, a second transistor electrically connected between a data line transmitting a data signal and the first node, wherein the second transistor turns on in response to the scan write signal, a third transistor electrically connected between the second node and the third node, wherein the third transistor turns on in response to the gate control signal, a fourth transistor electrically connected between a gate initialization voltage line transmitting a gate initialization voltage and the third node, wherein the fourth transistor turns on in response to the scan initialization signal, a fifth transistor electrically connected between the power supply line and the first node, wherein the fifth transistor turns on in response to the emission control signal, a sixth transistor electrically connected between the second node and a fourth node, wherein the sixth transistor turns on in response to the emission control signal, a seventh transistor electrically connected between an anode initialization voltage line transmitting an anode initialization voltage and the fourth node, wherein the seventh transistor turns on in response to the bias control signal, and an eighth transistor electrically connected between a bias voltage line transmitting a bias voltage and the first node, wherein the eighth transistor turns on in response to the bias control signal. The first node is electrically connected to a first electrode of the first transistor. The second node is electrically connected to a second electrode of the first transistor. The third node is electrically connected to a gate electrode of the first transistor. The fourth node is electrically connected to one of the plurality of light emitting elements. Each of the first transistor, the second transistor, the fifth transistor, the sixth transistor, the seventh transistor and the eighth transistor comprises a channel portion, a first electrode portion, and a second electrode portion disposed in the first semiconductor layer. Each of the third transistor and the fourth transistor comprises a channel portion, a first electrode portion, and a second electrode portion disposed in the second semiconductor layer.

According to an aspect of the present disclosure, an electronic device includes a display device displaying an image, a lower cover disposed below the display device, and a cover window disposed on the display device. The display device comprises a substrate comprising a display area in which a plurality of emission areas are arranged and a non-display area arranged around the display area, a circuit layer disposed on the substrate, and a plurality of light emitting elements disposed in the plurality of emission areas and disposed on the circuit layer. The circuit layer includes a light emitting pixel driver electrically connected to one of the plurality of light emitting elements, a set of gate lines connected to the light emitting pixel driver, a gate driver supplying a set of gate signals to the set of gate lines, and a power supply line disposed in the non-display area. The display device further includes a display driving circuit supplying a data signal to the circuit layer, and a timing controller controlling a driving timing of each of the gate driver and the display driving circuit. The gate driver includes a first signal driver electrically connected to one of the set of gate lines, and a second signal driver electrically connected to another gate signal of the set of gate lines. A first region where the first signal driver is disposed and a second region where the second signal driver is disposed are arranged in an extension direction of the set of gate lines. The circuit layer further includes a plurality of first through holes adjacent to one side of the first region where the first signal driver is disposed, a portion of the power supply line filling the plurality of first through holes, and a plurality of second through holes adjacent to a boundary between the first region and the second region. The electronic device further includes a plurality of etching blocking patterns arranged in island shapes and disposed on the substrate. At least some of the plurality of first through holes and the plurality of second through holes expose the plurality of etching blocking patterns.

At least a part of the second signal driver is symmetrical to the first signal driver with respect to the boundary between the first region and the second region. The gate driver includes at least one shared line disposed adjacent to the boundary between the first region and the second region and electrically connected to the first signal driver and the second signal driver. The at least one shared line overlaps at least a part of the plurality of second through holes.

The circuit layer comprises a first semiconductor layer disposed on the substrate; a first gate insulating layer covering the first semiconductor layer; a first gate conductive layer disposed on the first gate insulating layer; a second gate insulating layer covering the first gate conductive layer; a second gate conductive layer disposed on the second gate insulating layer; a first interlayer insulating layer covering the second gate conductive layer; a second semiconductor layer disposed on the first interlayer insulating layer; a third gate insulating layer covering the second semiconductor layer; a third gate conductive layer disposed on the third gate insulating layer; and a second interlayer insulating layer covering the third gate conductive layer. The second interlayer insulating layer, the third gate insulating layer, the first interlayer insulating layer, the second gate insulating layer and the first gate insulating layer each contain an inorganic insulating material. The first through holes and the second through holes each penetrate the second interlayer insulating layer, the third gate insulating layer, the first interlayer insulating layer, the second gate insulating layer and the first gate insulating layer.

The circuit layer further comprises a first source-drain conductive layer disposed on the second interlayer insulating layer; a first planarization layer covering the first source-drain conductive layer; a second source-drain conductive layer disposed on the first planarization layer; and a second planarization layer covering the second source-drain conductive layer. Each of the power supply line and the at least one shared line is disposed in the first source-drain conductive layer or the second source-drain conductive layer.

A circuit layer of the display device according to embodiments includes gate lines for transmitting a gate signal to light emitting pixel drivers, and a gate driver for supplying the gate signal to the gate lines. The gate driver includes a first stage electrically connected to one of the gate lines. The circuit layer further includes first through holes arranged around one side of the first stage.

In an embodiment, hydrogen (H) may be discharged through the first through holes, thereby reducing the influence of hydrogen on the threshold voltage of transistors included in the first stage.

Therefore, the output characteristics of the stages may be maintained relatively uniformly, which may improve the display quality and lifespan of the display device.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which:

FIG. 1 is a perspective view showing an electronic device according to an embodiment of the present disclosure;

FIG. 3 is a perspective view illustrating the display device of FIG. 2 according to an embodiment of the present disclosure;

DETAILED DESCRIPTION OF THE EMBODIMENTS

Figure 2:
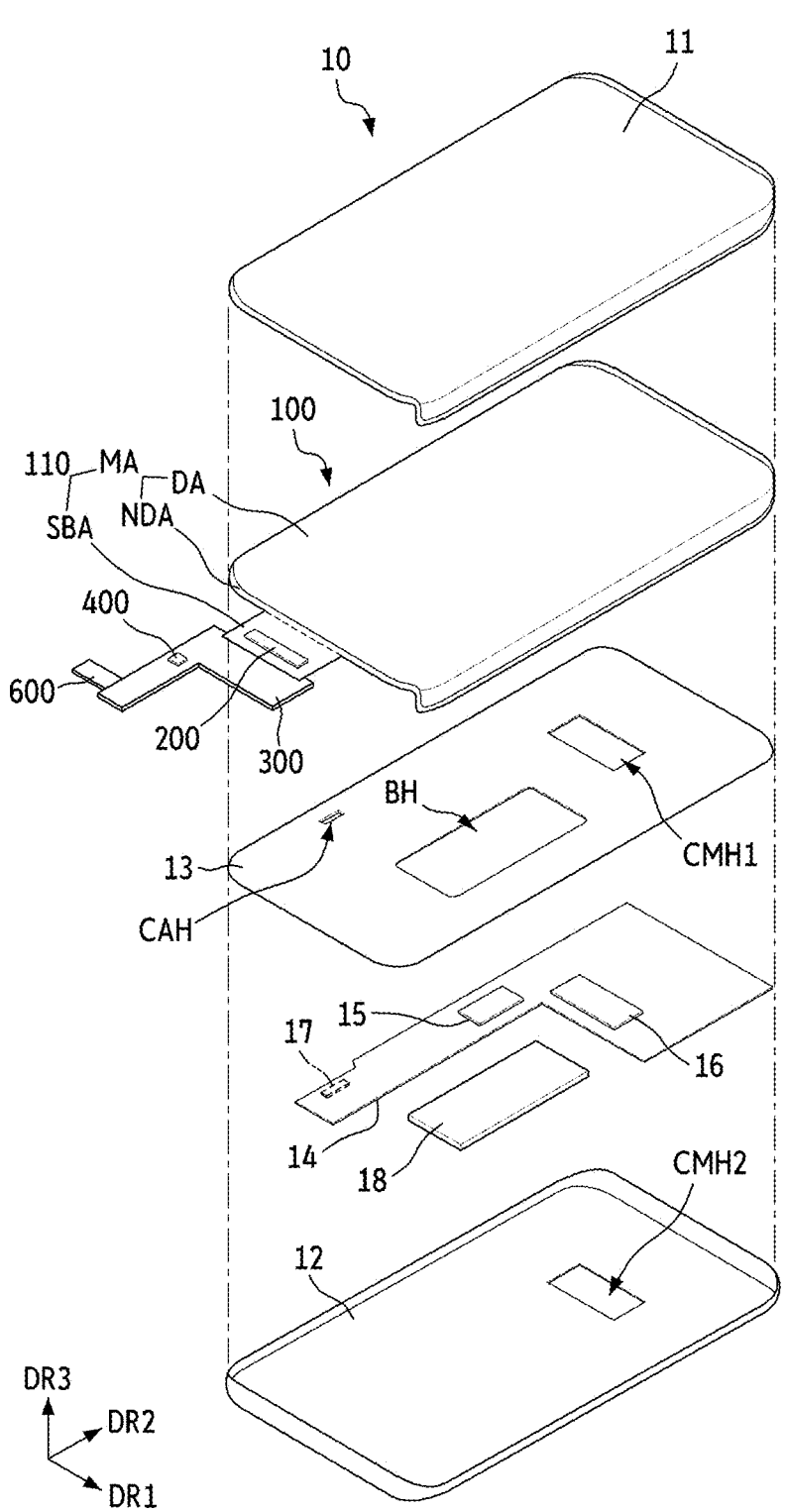
FIG. 2 is an exploded perspective view of the electronic device shown in FIG. 1 according to an embodiment of the present disclosure.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within +30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification. According to an aspect of the present disclosure, a display device includes a circuit layer with gate lines that transmit gate signals to light-emitting pixel drivers and a gate driver that supplies these signals to the gate lines. The gate driver comprises a first signal driver electrically connected to one of the gate lines. Additionally, the circuit layer includes first through holes positioned around one side of the first signal driver. The through holes facilitate the discharge of hydrogen (H), thereby mitigating its impact on the threshold voltage of the transistors within the first stage. As a result, the output characteristics of the stages can be maintained more consistently, contributing to improved display quality and an extended lifespan of the display device.

Hereinafter, embodiments will be described with reference to the accompanying drawings.

Figure 1:
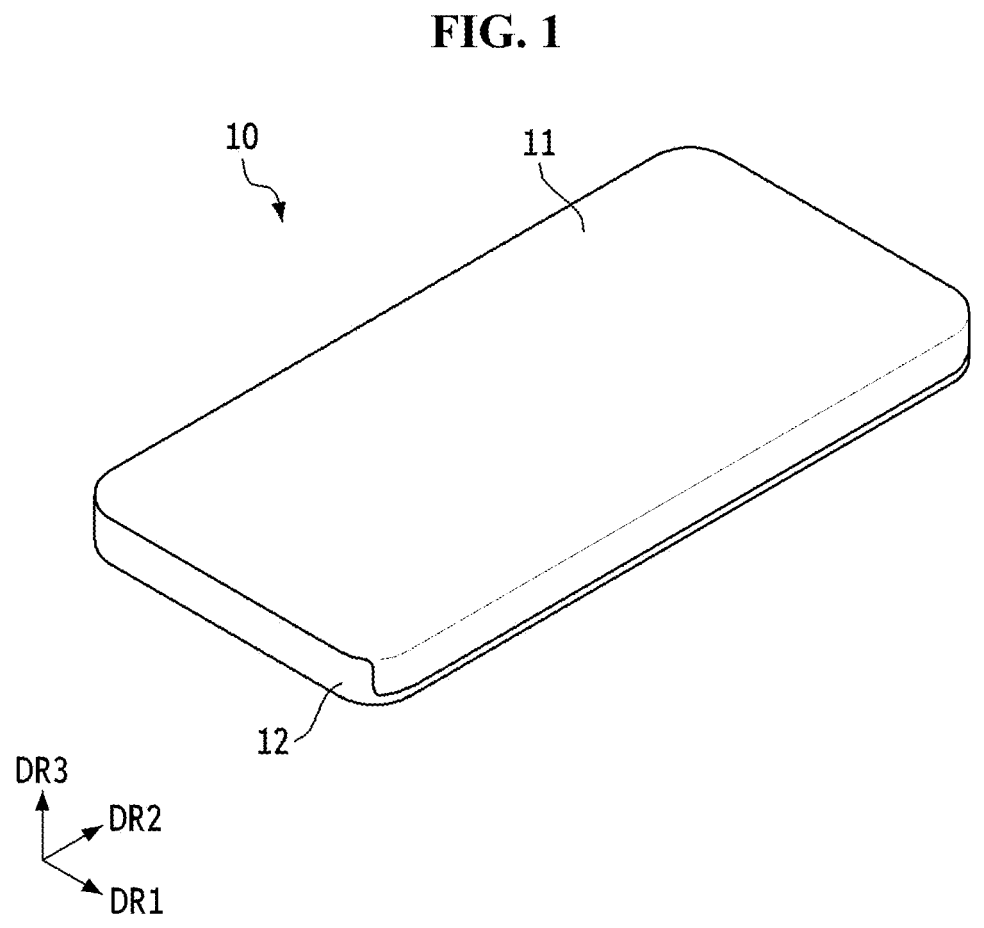

FIG. 1 is a perspective view showing an electronic device according to one embodiment. FIG. 2 is an exploded perspective view of the electronic device shown in FIG. 1.

Referring to FIG. 1, an electronic device 10 according to one embodiment is a device having a function of displaying an image in a display area. The electronic device 10 may provide portability. For example, the electronic device 10 may be a portable electronic device such as a mobile phone, a smartphone, a tablet personal computer (PC), a smart watch, a watch phone, a mobile communication terminal, an electronic notebook, an electronic book, a portable multimedia player (PMP), a navigation device and an ultramobile PC (UMPC).

However, the electronic device 10 according to one embodiment is not limited to a portable electronic device, and may be a large-sized device such as a television, a laptop computer, a monitor, a billboard, and an Internet-of-Things (IoT) device.

The electronic device 10 according to one embodiment may include a cover window 11 and a lower cover 12, which are provided as a housing to protect a display device 100 (see FIG. 2).

Referring to FIG. 2, the electronic device 10 may further include the display device 100, a bracket 13, and a main circuit board 14, which are accommodated between the cover window 11 and the lower cover 12.

The display device 100 may include a main region MA including a display area DA where an image is displayed and a non-display area NDA around the display area DA, and a sub-region SBA protruding from one side of the main region MA.

The display device 100 may further include a display driving circuit 200 disposed in the sub-region SBA, a display circuit board 300 bonded to one side of the sub-region SBA, a touch driving circuit 400 mounted on the display circuit board 300, and a cable 600 extending from one side of the display circuit board 300.

In the present specification, a first direction DR1 may be a direction parallel to a short side of the electronic device 10 in a plan view, that is, a horizontal direction of the electronic device 10. A second direction DR2 may be a direction parallel to a long side of the electronic device 10 in a plan view, that is, a vertical direction of the electronic device 10. A third direction DR3 may be a thickness direction of the electronic device 10.

The electronic device 10 may have a shape close to a rectangular shape in a plan view. For example, the electronic device 10 may have a rectangular shape, in a plan view, having a short side in the first direction DR1 and a long side in the second direction DR2. A corner where the short side in the first direction DR1 and the long side in the second direction DR2 meet may be right-angled or rounded with a predetermined curvature. The planar shape of the electronic device 10 is not limited to the rectangular shape, and may be formed in another polygonal shape, a circular shape or an elliptical shape.

The cover window 11 may be disposed on the display device 100 to cover the top surface of the display device 100. The cover window 11 may serve to protect the top surface of the display device 100.

The cover window 11 may include a light transmitting portion that is transparent and a light blocking portion that is opaque.

The light transmitting portion may overlap the display area DA of the display device 100 in the third direction DR3, and the light blocking portion may overlap the non-display area NDA of the display device 100 in the third direction DR3.

The cover window 11 may include a top surface portion forming the top surface of the electronic device 10, a left surface portion forming the left side surface of the electronic device 10, and a right surface portion forming the right side surface of the electronic device 10. The left surface portion of the cover window 11 may extend from the left side of the top surface portion, and the right surface portion thereof may extend from the right side of the top surface portion.

Each of the top, left, and right surface portions of the cover window 11 may include the light transmitting portion and the light blocking portion.

The light transmitting portion of the cover window 11 may be disposed on most of each of the top, left, and right surface portions of the cover window 11.

The light blocking portion of the cover window 11 may be disposed at the upper edge and lower edge of the top surface portion of the cover window 11, the upper edge, left edge, and lower edge of the left surface portion of the cover window 11, and the upper edge, right edge, and lower edge of the right surface portion of the cover window 11.

The display device 100 may be disposed below the cover window 11.

For example, the cover window 11 may be disposed on the display device 100.

The display device 100 may include a top surface portion facing the top surface portion of the cover window 11, a left side portion facing the left side portion of the cover window 11, and a right side portion facing the right side portion of the cover window 11. The left surface portion of the display device 100 may extend from the left side of the top surface portion, and the right surface portion of the display device 100 may extend from the right side of the top surface portion.

The display device 100 may include the main region MA serving as a display surface and the sub-region SBA protruding from at least a part of one side of the main region MA.

The main region MA may include the display area DA displaying an image and the non-display area NDA that is a peripheral area of the display area DA.

The display area DA may be disposed in most of the main region MA. The display area DA may be disposed at the center of the main region MA.

In an embodiment, each of the top, left, and right surface portions of the display device 100 may include the display area DA and the non-display area NDA.

The display area DA may be disposed on most of each of the top, left, and right surface portions of the display device 100.

The non-display area NDA may be disposed outside the display area DA. The non-display area NDA may be an edge area of the main region MA.

The non-display area NDA may be disposed at the upper edge and lower edge of the top surface portion of the display device 100, the upper edge, left edge, and lower edge of the left surface portion of the display device 100, and the upper edge, right edge, and lower edge of the right surface portion of the display device 100.

The sub-region SBA may protrude from one side of the main region MA in the second direction DR2.

The length of the sub-region SBA in the first direction DR1 may be less than or equal to the length of the main region MA in the first direction DR1. The length of the sub-region SBA in the second direction DR2 may be less than the length of the main region MA in the second direction DR2, but is not limited thereto.

Since a part of the sub-region SBA is transformed to be bent, another part of the sub-region SBA may overlap the main region MA in the third direction DR3.

The display driving circuit 200 may be mounted on the sub-region SBA, and the display circuit board 300 may be attached to the sub-region SBA.

One end of the display circuit board 300 may be attached to pads disposed at the lower edge of the sub-region SBA of the display device 100 by using an anisotropic conductive film.

The display circuit board 300 may be a flexible printed circuit board (FPCB) which is bendable, a rigid printed circuit board (PCB) which maintains a flat shape, or a composite printed circuit board having both of the rigid printed circuit board and the flexible printed circuit board.

Figure 7:
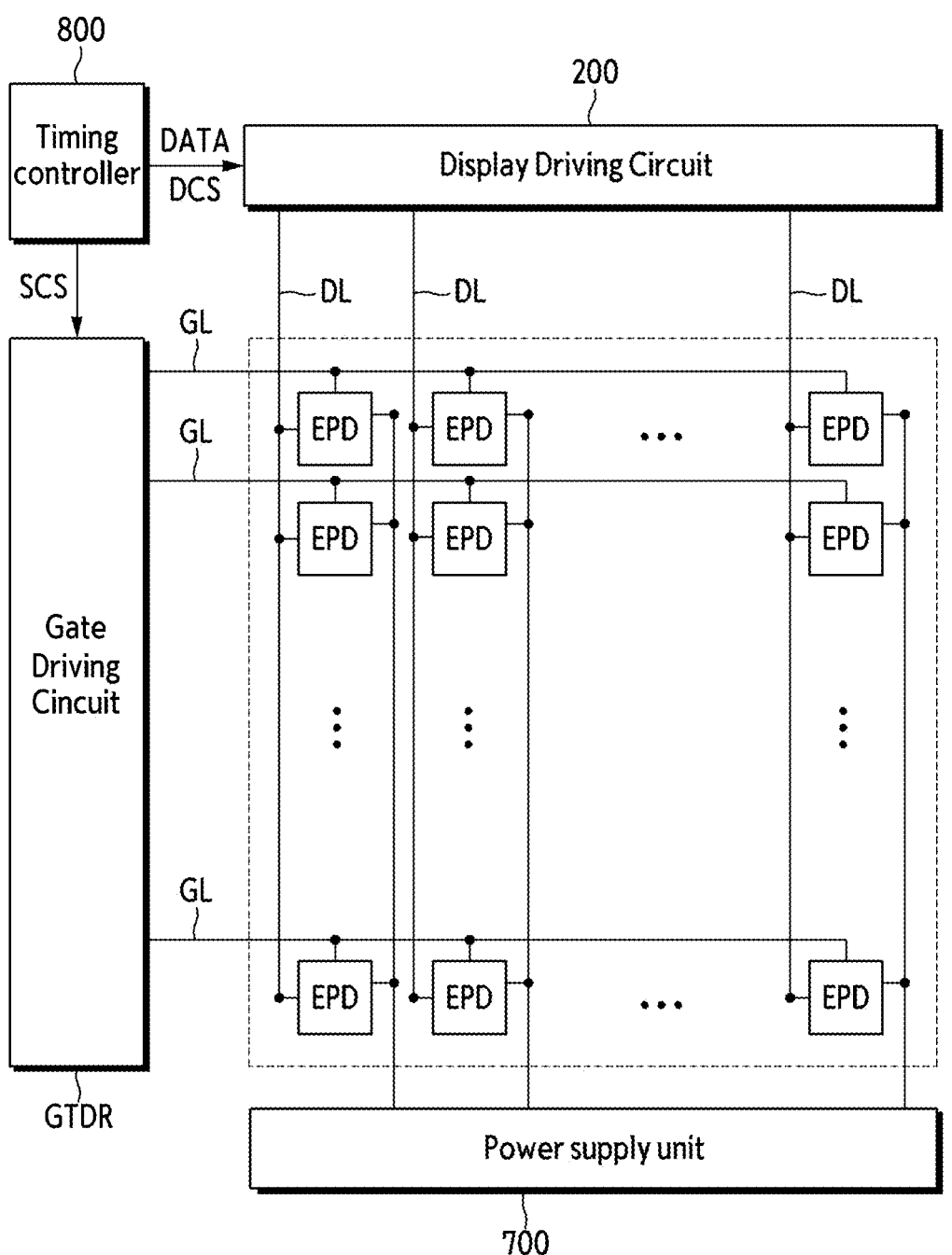
FIG. 7 is a block diagram showing the display device of FIG. 2 according to an embodiment of the present disclosure.

Based on control signals, power and voltages supplied through the display circuit board 300, the display driving circuit 200 may transmit a data signal Vdata (see FIG. 8) of each of light emitting pixel drivers EPD (see FIG. 7) of the display area DA to data lines DL (see FIG. 7).

The display driving circuit 200 may be provided as an integrated circuit (IC) and mounted on the sub-region SBA of the display device 100 by a chip on glass (COG) method, a chip on plastic (COP) method, or an ultrasonic method. However, this is only an example, and one embodiment is not limited thereto. For example, the display driving circuit 200 may be mounted on the display circuit board 300.

According to one embodiment, the touch driving circuit 400 may be further mounted on the sub-region SBA of the display device 100.

Alternatively, as shown in FIG. 2, the touch driving circuit 400 may be mounted on the display circuit board 300.

The touch driving circuit 400 may be electrically connected to a touch sensor layer 150 (see FIG. 4) of the display device 100.

As shown in FIG. 2, the bracket 13 may be disposed under the display device 100.

The bracket 13 may include plastic or metal. The bracket 13 may include a first camera hole CMH1 into which a camera device 16 is inserted, a battery hole BH into which a battery 18 is disposed, and a cable hole CAH through which the cable 600 connected to the display circuit board 300 passes.

The main circuit board 14 and the battery 18 may be disposed under the bracket 13.

The main circuit board 14 may be a printed circuit board or a flexible printed circuit board.

The main circuit board 14 may include a main processor 15, the camera device 16, and a main connector 17. The main processor 15 may be formed as an integrated circuit.

The camera device 16 may be disposed on both the top surface and the bottom surface of the main circuit board 14, the main processor 15 may be disposed on the top surface of the main circuit board 14, and the main connector 17 may be disposed on the bottom surface of the main circuit board 14.

The main processor 15 may control all functions of the electronic device 10.

For example, the main processor 15 may output digital video data to the display driving circuit 200 through the display circuit board 300 such that the display device 100 displays an image. The main processor 15 may receive touch data including user's touch coordinates from the touch driving circuit 400, determine whether or not the user has touched or approached, and then perform an operation corresponding to the user's touch input or approach input. For example, the main processor 15 may perform an operation or execute an application indicated by an icon touched by the user.

The main processor 15 may be an application processor formed of an integrated circuit, a central processing unit, or a system chip.

The camera device 16 may process an image frame of a still image or video obtained by an image sensor in a camera mode and output it to the main processor 15.

The cable 600 having passed through the cable hole CAH of the bracket 13 may be connected to the main connector 17. Thus, the main circuit board 14 may be electrically connected to the display circuit board 300.

The battery 18 may be disposed so as not to overlap the main circuit board 14 in the third direction DR3. The battery 18 may overlap the battery hole BH of the bracket 13 in the third direction DR3.

The main circuit board 14 may be further equipped with a mobile communication module capable of transmitting and receiving radio signals with at least one of a base station, an external terminal, or a server in a mobile communication network. The radio signal may include various types of data according to transmission and reception of a voice signal, a video call signal, or a text/multimedia message.

The lower cover 12 may be disposed below the main circuit board 14 and the battery 18. The lower cover 12 may be fixed by being fastened to the bracket 13. The lower cover 12 may form the upper side surface, lower side surface, and bottom surface of the electronic device 10. The lower cover 12 may include plastic, metal, or both plastic and metal.

The lower cover 12 may include a second camera hole CMH2 through which the bottom surface of the camera device 16 is exposed. The position of the camera device 16 and the positions of the first camera hole CMH1 and the second camera hole CMH2 corresponding to the camera device 16 are not limited by the illustration of FIG. 2.

Next, the display device 100 according to one embodiment will be described.

Figure 3:
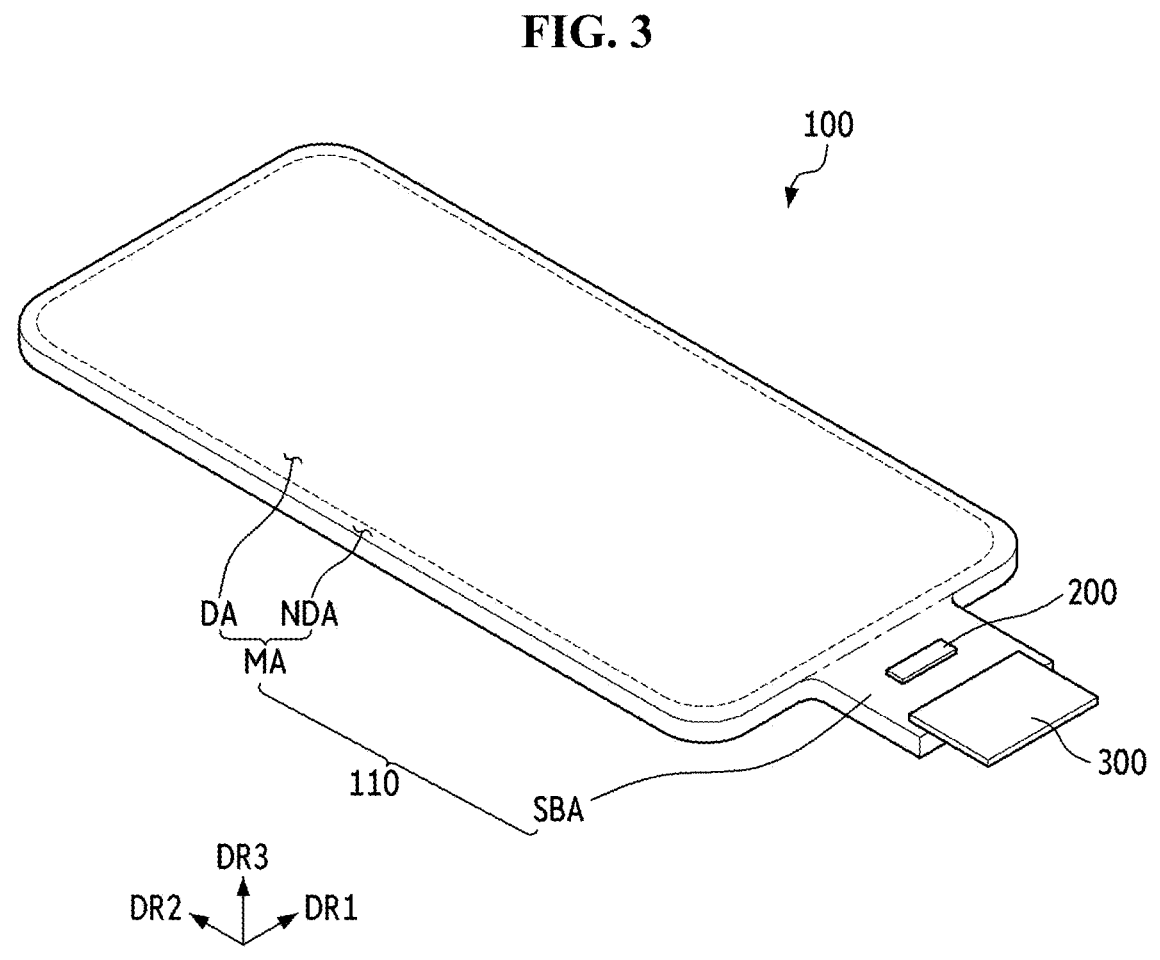
Figure 4:
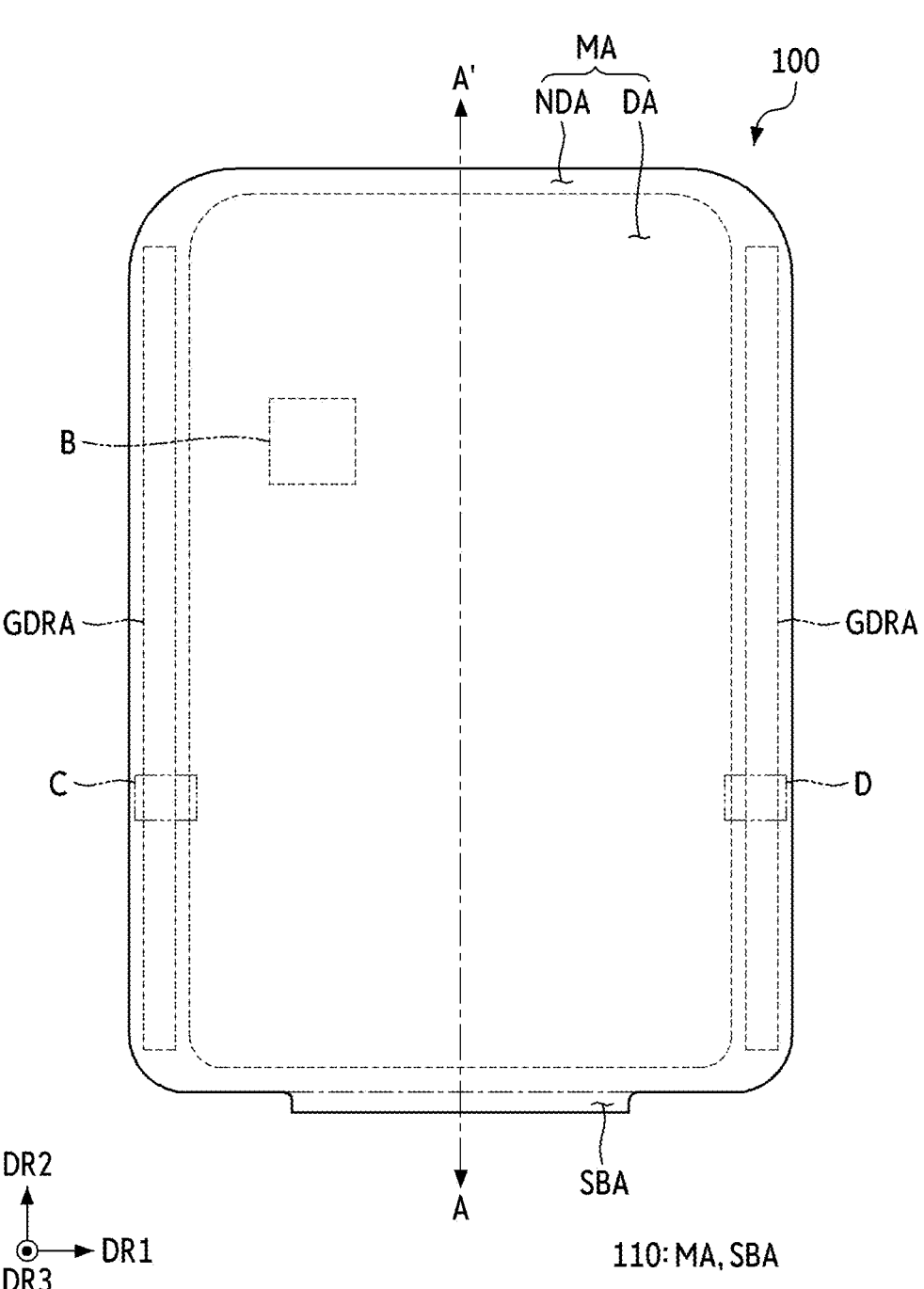
FIG. 4 is a plan view illustrating the display device of FIG. 3 according to an embodiment of the present disclosure.
Figure 5:
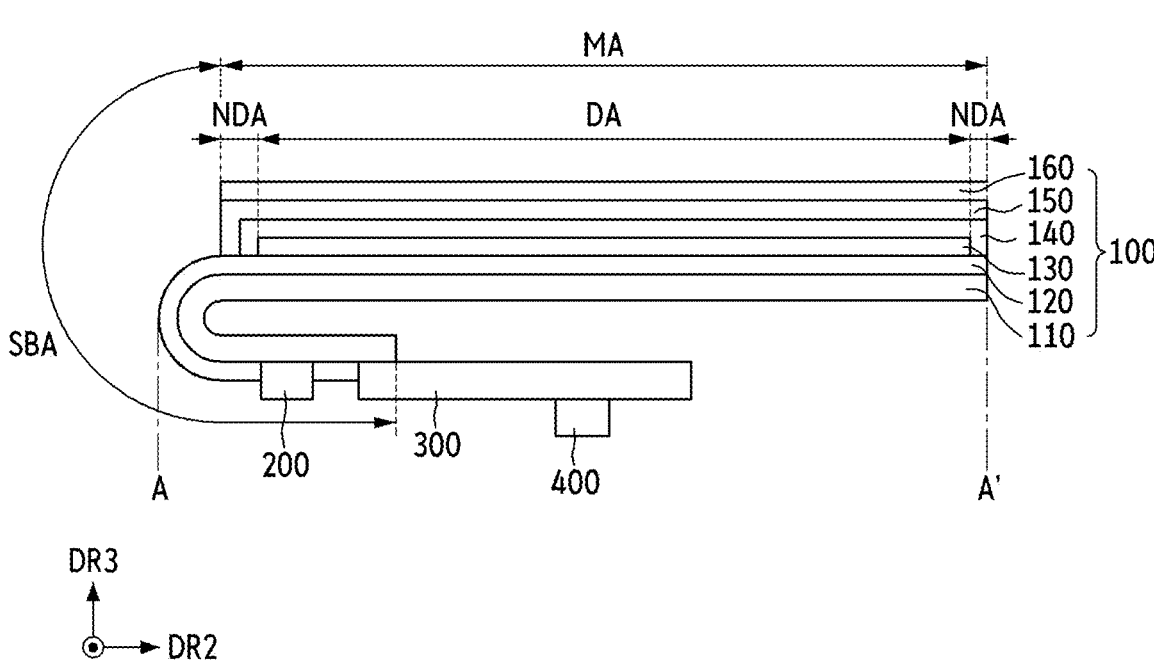
FIG. 5 is a cross-sectional view taken along line A-A' of FIG. 4 according to an embodiment of the present disclosure.

FIG. 3 is a perspective view illustrating the display device of FIG. 2. FIG. 4 is a plan view illustrating the display device of FIG. 3. FIG. 5 is a cross-sectional view taken along line A-A' of FIG. 4.

Referring to FIGS. 3 and 4, the display device 100 according to embodiments, which is a device for displaying a moving image or a still image, may be used as a display screen of various devices, such as a television, a laptop computer, a monitor, a billboard and an Internet-of-Things (IoT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 100 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 100 is an organic light emitting display device. However, the present disclosure is not limited thereto, and may be applied to a display device including an organic insulating material, an organic light emitting material, and a metal material.

The display device 100 may be formed to be flat, but is not limited thereto. For example, the display device 100 may include a curved portion formed at left and right ends and having a constant curvature or a varying curvature. In an embodiment, the display device 100 may be formed to be flexible so that it can be curved, bent, folded, or rolled.

As illustrated in FIGS. 3, 4 and 5, the display device 100 according to embodiments may include a substrate 110.

The substrate 110 may include the main region MA corresponding to a display surface of the display device 100 and the sub-region SBA protruding from one side of the main region MA.

As shown in FIG. 4, the main region MA may include the display area DA disposed at most of the center thereof, and the non-display area NDA disposed around the display area DA.

The display area DA may, in a plan view, be formed in a rectangular shape having short sides extending in the first direction DR1 and long sides extending in the second direction DR2 crossing the first direction DR1. The corner where the short side in the first direction DR1 and the long side in the second direction DR2 meet may be rounded to have a predetermined curvature or may be right-angled. The planar shape of the display area DA is not limited to the rectangular shape, and may be formed in another polygonal shape, a circular shape or an elliptical shape.

The non-display area NDA may be disposed at the edge of the main region MA to surround the display area DA.

The sub-region SBA may be a region protruding from the non-display area NDA of the main region MA to one side in the second direction DR2.

The display device 100 may include the display driving circuit 200 disposed in the sub-region SBA and the display circuit board 300 bonded to one side of the sub-region SBA.

FIGS. 4 and 5 illustrate the display device 100 with a part of the sub-region SBA in a bent state.

As shown in FIGS. 4 and 5, a part of the sub-region SBA is transformed to be curved, so that another part of the sub-region SBA may be disposed on the rear surface of the display device 100.

Referring to FIG. 5, the display device 100 according to embodiments includes the substrate 110, a circuit layer 120 disposed on the substrate 110, and an element layer 130 disposed on the circuit layer 120.

The display device 100 according to embodiments may further include an encapsulation layer 140 disposed on the element layer 130, and a touch sensor layer 150 disposed on the encapsulation layer 140.

The display device 100 according to embodiments may further include a polarization layer 160 disposed on the touch sensor layer 150 to reduce reflection of external light.

The substrate 110 may be formed of an insulating material such as polymer resin. For example, the substrate 110 may be formed of polyimide. The substrate 110 may be a flexible substrate which can be bent, folded or rolled.

Alternatively, the substrate 110 may be formed of an insulating material such as glass.

The substrate 110 may include the main region MA and the sub-region SBA. The main region MA may include the display area DA and the non-display area NDA.

The display device 100 may further include the display driving circuit 200 disposed in the sub-region SBA, the display circuit board 300 bonded to one side of the sub-region SBA, and the touch driving circuit 400 mounted on the display circuit board 300.

The display driving circuit 200 may supply the data signals Vdata (see FIG. 8) to data lines DL (see FIG. 8) of the circuit layer 120.

The display circuit board 300 may be connected to signal pads disposed at the edge of the sub-region SBA and may be electrically connected to the circuit layer 120 or the display driving circuit 200.

The touch driving circuit 400 may be electrically connected to the touch sensor layer 150.

The circuit layer 120 may include insulating layers, conductive layers, and one or more semiconductor layers. One or more insulating layers may be interposed between the conductive layers and one or more semiconductor layers. The circuit layer 120 may include transistors provided in one or more semiconductor layers and one or more conductive layers, and signal lines each being provided in at least one of the conductive layers.

The element layer 130 may include light emitting elements.

The encapsulation layer 140 may cover the circuit layer 120 and the element layer 130, and may block permeation of oxygen or moisture into the element layer 130.

The touch sensor layer 150 may include touch electrodes and touch lines connected thereto.

The touch driving circuit 400 may apply a touch driving signal to driving lines of the touch sensor layer 150, and receive a touch sensing signal from sensing lines. Further, the touch driving circuit 400 may detect charge variation amounts of capacitances based on the touch sensing signal, thereby determining whether a user has touched or approached. The user's touch means that an object such as a pen and a user's finger is in direct contact with the top surface of the cover window disposed on the touch sensor layer. The user's approach means that the object such as the pen and the user's finger hovers over the top surface of the cover window. The touch driving circuit 400 may output touch data including the user's touch coordinates to a main processor.

Figure 6:
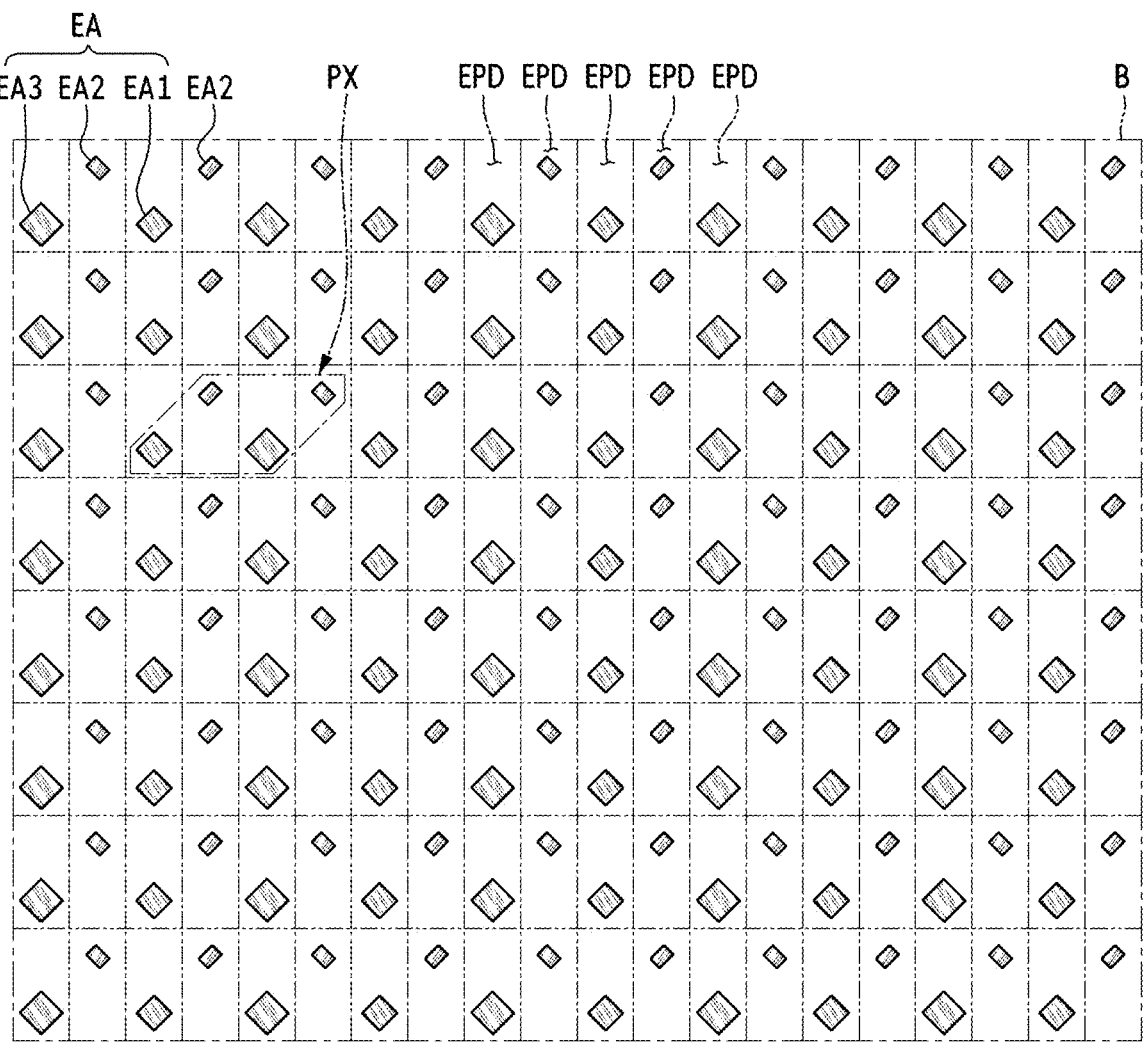
FIG. 6 is a layout diagram illustrating part B of FIG. 4 according to an embodiment of the present disclosure.
Figure 6:
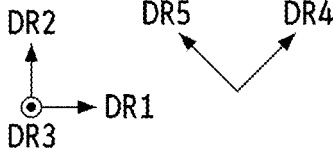

FIG. 6 is a layout diagram illustrating part B of FIG. 4.

Referring to FIG. 6, the display area DA of the display device 100 according to embodiments may include emission areas EA. The display area DA may further include a non-emission area disposed in a gap between the emission areas EA.

The element layer 130 (see FIG. 5) may include light emitting elements LE (see FIG. 8) respectively disposed in the emission areas EA.

The circuit layer 120 (see FIG. 5) may include light emitting pixel drivers EPD arranged side by side in the first direction DR1 and the second direction DR2 in the main region MA. The light emitting pixel drivers EPD may be respectively electrically connected to the light emitting elements LE (see FIG. 8) of the element layer 130.

The emission areas EA may have a rhombic shape or a rectangular shape in a plan view. However, this is only an example, and the planar shape of the emission areas EA according to one embodiment is not limited to that illustrated in FIG. 6. For example, in a plan view, the emission areas EA may have a polygonal shape such as a quadrangle, a pentagon, and a hexagon, or may have a circular or elliptical shape including the edge of a curve.

The emission areas EA may include first emission areas EA1 that emit light in a first wavelength band, second emission areas EA2 that emit light in a second wavelength band lower than the first wavelength band, and third emission areas EA3 that emit light in a third wavelength band lower than the second wavelength band.

For example, the first wavelength band may be about 600 nm to about 750 nm, and the light in the first wavelength band may be red. The second wavelength band is about 480 nm to about 560 nm, and light in the second wavelength band may be green. The third wavelength band is about 370 nm to about 460 nm, and light in the third wavelength band may be blue.

The first emission areas EA1 and the third emission areas EA3 may be alternately arranged in the first direction DR1 or the second direction DR2.

The second emission area EA2 may be arranged parallel to each other in the first direction DR1 or the second direction DR2.

The second emission areas EA2 may be adjacent to the first emission areas EA1 and the third emission areas EA3 in diagonal directions DR4 and DR5 crossing the first direction DR1 and the second direction DR2.

Pixels PX displaying their own luminance and colors may be provided by the first emission area EA1, the second emission area EA2, and the third emission area EA3 adjacent to each other among these emission areas EA.

In other words, the pixel PX may be a basic unit for displaying various colors including white with a predetermined luminance.

Each of the pixels PX may include at least one first emission area EA1, at least one second emission area EA2, and at least one third emission area EA3 that are adjacent to each other. Accordingly, each of the pixels PX may display various colors through a mixture of the light emitted from the first emission area EA1, the second emission area EA2, and the third emission area EA3 that are adjacent to each other.

FIG. 7 is a block diagram showing the display device of FIG. 2.

Referring to FIG. 7, the circuit layer 120 of the display device 100 according to one embodiment may include the light emitting pixel drivers EPD electrically connected to the light emitting elements LE (see FIG. 8) disposed in the emission areas EA of the display area DA, and the data lines DL electrically connected to the light emitting pixel drivers EPD.

Figure 8:
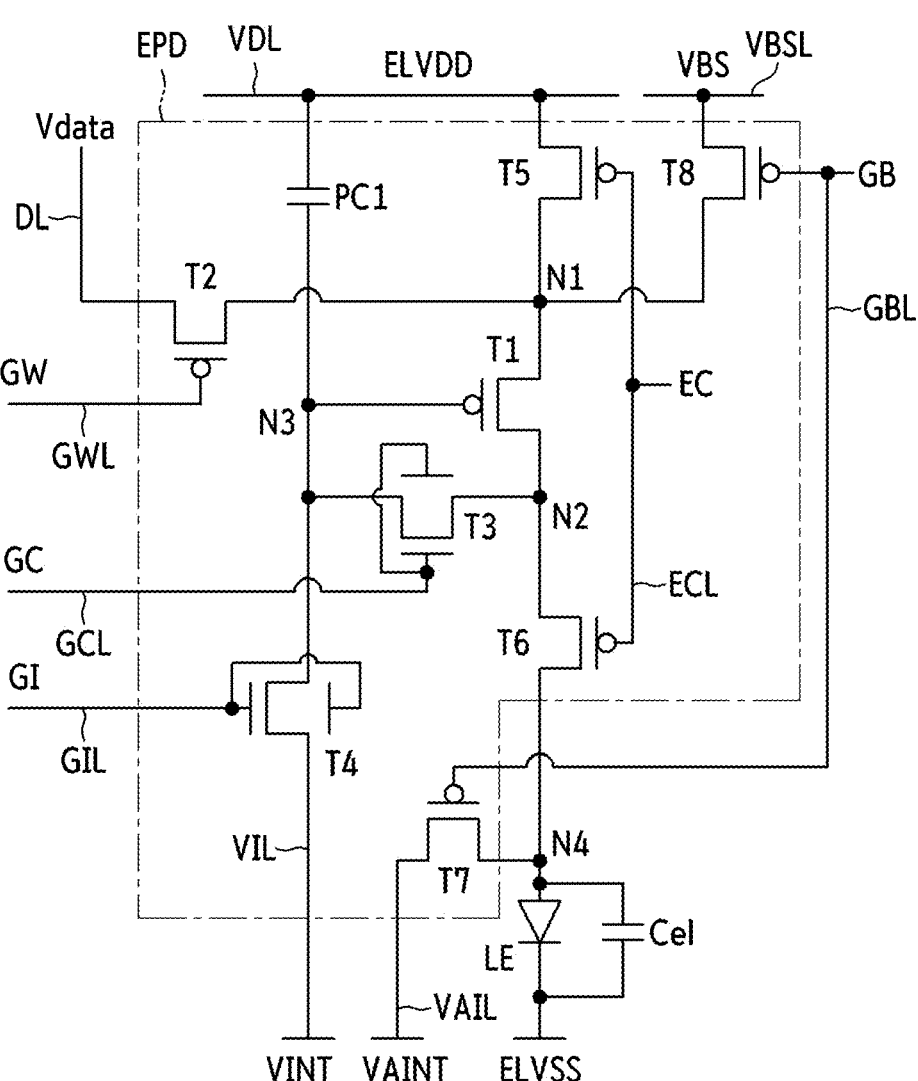
FIG. 8 is an equivalent circuit diagram showing the light emitting pixel driver of FIG. 7 according to an embodiment of the present disclosure.

According to one embodiment, the display device 100 may further include the display driving circuit 200 that transmits the data signals Vdata (see FIG. 8) of the light emitting pixel drivers EPD to the data lines DL in order to control the luminance of each of the light emitting elements LE (see FIG. 8).

According to one embodiment, the display device 100 may further include a gate driver GTDR that supplies one or more gate signals to the light emitting pixel drivers EPD, a power supply unit 700 that supplies power and voltages to the light emitting pixel drivers EPD, and a timing controller 800 that controls the driving timing of each of the display driving circuit 200 and the gate driver GTDR.

The timing controller 800 receives an image signal supplied from the outside of the display device 100.

The timing controller 800 may output image data DATA and a data control signal DCS to the display driving circuit 200.

The timing controller 800 may generate a scan control signal SCS for controlling the operation timing of the gate driver GTDR.

The display driving circuit 200 may convert the image data DATA into analog data voltages and output them to the data lines DL.

The gate driver GTDR may generate gate signals in response to the scan control signal SCS and sequentially output the gate signals to gate lines GL.

The gate lines GL may include a scan write line GWL that transmits a scan write signal GW (see FIG. 8), a scan initialization line GIL that transmits a scan initialization signal GI (see FIG. 8), a gate control line GCL that transmits a gate control signal GC (see FIG. 8), emission control lines ECL that transmit emission control signals EC (see FIG. 8), and bias control lines GBL that transmit bias control signals GB (see FIG. 8).

The gate signals may have pulses that vary to a first gate level voltage or a second gate level voltage.

The power supply unit 700 may supply various power and voltages necessary for driving the light emitting pixel drivers EPD.

For example, the power supply unit 700 may supply a first power ELVDD (see FIG. 8) and a second power ELVSS (see FIG. 8) for generating a driving signal transmitted to the light emitting elements LE, and a gate initialization voltage VINT (see FIG. 8) and an anode initialization voltage VAINT (see FIG. 8) for initializing the light emitting pixel drivers EPD.

FIG. 8 is an equivalent circuit diagram showing the light emitting pixel driver of FIG. 7.

Referring to FIG. 8, the light emitting pixel drivers EPD of the circuit layer 120 may be electrically connected between a first power ELVDD and the light emitting elements LE of the element layer 130.

The light emitting elements LE of the element layer 130 may be electrically connected between the light emitting pixel drivers EPD of the circuit layer 120 and a second power ELVSS.

For example, an anode electrode of one light emitting element LE may be electrically connected to the light emitting pixel driver EPD, and the second power ELVSS having a lower voltage level than the first power ELVDD may be applied to a cathode electrode of one light emitting element LE.

A capacitor Cel connected in parallel with the light emitting element LE refers to a parasitic capacitance between the anode electrode and the cathode electrode.

The circuit layer 120 may include the gate lines GL that transmit a gate signal to the light emitting pixel drivers EPD. Each of the gate lines GL may be electrically connected to a gate electrode of at least one of transistors T1 to T8 provided in each of the light emitting pixel drivers EPD and may transmit a gate signal.

The gate lines GL may include the scan write line GWL for transmitting the scan write signal GW, the scan initialization line GIL for transmitting the scan initialization signal GI, an emission control line ECL for transmitting an emission control signal EC, the gate control line GCL for transmitting the gate control signal GC, and a bias control line GBL for transmitting a bias control signal GB.

The circuit layer 120 may include the data line DL for transmitting the data signal Vdata, a first power line VDL for transmitting the first power ELVDD, a gate initialization voltage line VIL for transmitting the gate initialization voltage VINT, an anode initialization voltage line VAIL for transmitting the anode initialization voltage VAINT, and a bias voltage line VBSL for transmitting a bias voltage VBS.

Each of the light emitting pixel drivers EPD may include a first transistor T1 generating a driving current of the light emitting element LE, two or more transistors T2 to T8 electrically connected to the first transistor T1 or the light emitting element LE, and at least one pixel capacitor PC1.

The first transistor T1 may be electrically connected between a first node N1 and a second node N2. The first node N1 is electrically connected to the first electrode (e.g., source electrode) of the first transistor T1. The second node N2 is electrically connected to the second electrode (e.g., drain electrode) of the first transistor T1.

The first node N1 may be electrically connected to the first power line VDL through the fifth transistor T5.

The second node N2 may be electrically connected to the anode electrode of the light emitting element LE through the sixth transistor T6.

The pixel capacitor PC1 may be electrically connected between the first power line VDL and a third node N3. The third node N3 is electrically connected to the gate electrode of the first transistor T1.

For example, the pixel capacitor PC1 may be electrically connected between the gate electrode of the first transistor T1 and the first power line VDL.

Accordingly, the potential of the gate electrode of the first transistor T1 may be maintained at the voltage charged in the pixel capacitor PC1.

The second transistor T2 may be electrically connected between the data line DL and the first node N1.

The second transistor T2 may be electrically connected between the first electrode of the first transistor T1 and the data line DL.

For example, the first electrode of the first transistor T1 may be electrically connected to the data line DL through the second transistor T2.

The second transistor T2 may be turned on by the scan write signal GW of the scan write line GWL.

The fifth transistor T5 may be electrically connected between the first node N1 and the first power line VDL.

The sixth transistor T6 may be electrically connected between the second node N2 and a fourth node N4. The fourth node N4 is electrically connected to the anode electrode of the light emitting element LE.

For example, the fifth transistor T5 may be electrically connected between the first electrode of the first transistor T1 and the first power line VDL.

The sixth transistor T6 may be electrically connected between the second electrode of the first transistor T1 and the anode electrode of the light emitting element LE.

The fifth transistor T5 and the sixth transistor T6 may be turned on by the emission control signal EC of the emission control line ECL.

When the data signal Vdata of the data line DL is transmitted to the first electrode of the first transistor T1 through the turned-on second transistor T2, the voltage difference between the gate electrode of the first transistor T1 and the first electrode of the first transistor T1 may be a difference voltage between the first power ELVDD and the data signal Vdata.

When the voltage difference between the gate electrode of the first transistor T1 and the first electrode of the first transistor T1, i.e., the gate-source voltage difference becomes equal to or greater than a threshold voltage, the first transistor T1 may be turned on, thereby generating a drain-source current of the first transistor T1 corresponding to the data signal Vdata.

Subsequently, when the fifth transistor T5 and the sixth transistor T6 are turned on, the first power ELVDD, the first transistor T1, the light emitting element LE, and the second power ELVSS may be connected in series. Accordingly, the drain-source current of the first transistor T1 corresponding to the data signal Vdata may be supplied as a driving current of the light emitting element LE.

Accordingly, the light emitting element LE may emit light having a luminance corresponding to the data signal Vdata.

The third transistor T3 may be electrically connected between the second node N2 and the third node N3. For example, the third transistor T3 may be electrically connected between the gate electrode of the first transistor T1 and the second electrode of the first transistor T1. The third transistor T3 may be turned on by the gate control signal GC of the gate control line GCL.

Through the turned-on third transistor T3, the voltage difference between the second node N2 and the third node N3 may be initialized.

The fourth transistor T4 may be electrically connected between the gate initialization voltage line VIL and the third node N3. For example, the fourth transistor T4 may be connected between the gate electrode of the first transistor T1 and the gate initialization voltage line VIL. The fourth transistor T4 may be turned on by the scan initialization signal GI of the scan initialization line GIL.

Through the turned-on fourth transistor T4, the potential of the third node N3 may be initialized to the gate initialization voltage VINT of the gate initialization voltage line VIL.

The third transistor T3 and the fourth transistor T4 may be provided as N-type MOSFETs.

The seventh transistor T7 may be electrically connected between the fourth node N4 and the anode initialization voltage line VAIL. For example, the seventh transistor T7 may be electrically connected between the anode electrode of the light emitting element LE and the anode initialization voltage line VAIL. The seventh transistor T7 may be turned on by the bias control signal GB of the bias control line GBL.

The potential of the fourth node N4 may be initialized through the turned-on seventh transistor T7.

The eighth transistor T8 may be electrically connected between the first node N1 and the bias voltage line VBL. For example, the eighth transistor T8 may be electrically connected between the first electrode of the first transistor T1 and the bias voltage line VBL. The eighth transistor T8 may be turned on by the bias control signal GB of the bias control line GBL.

The potential of the first node N1 may be initialized through the turned-on eighth transistor T8.

Each of the third transistor T3 and the fourth transistor T4 among the first to eighth transistors T1 to T8 included in the light emitting pixel driver EPD may be implemented as an N-type MOSFET, and each of the remaining transistors T1, T2, and T5 to T8 except for these two may be implemented as a P-type MOSFET.

Accordingly, the circuit layer 120 may include a first semiconductor layer SEL1 (see FIG. 9) for providing a P-type MOSFET and a second semiconductor layer SEL2 (see FIG. 9) for providing an N-type MOSFET.

Figure 9:
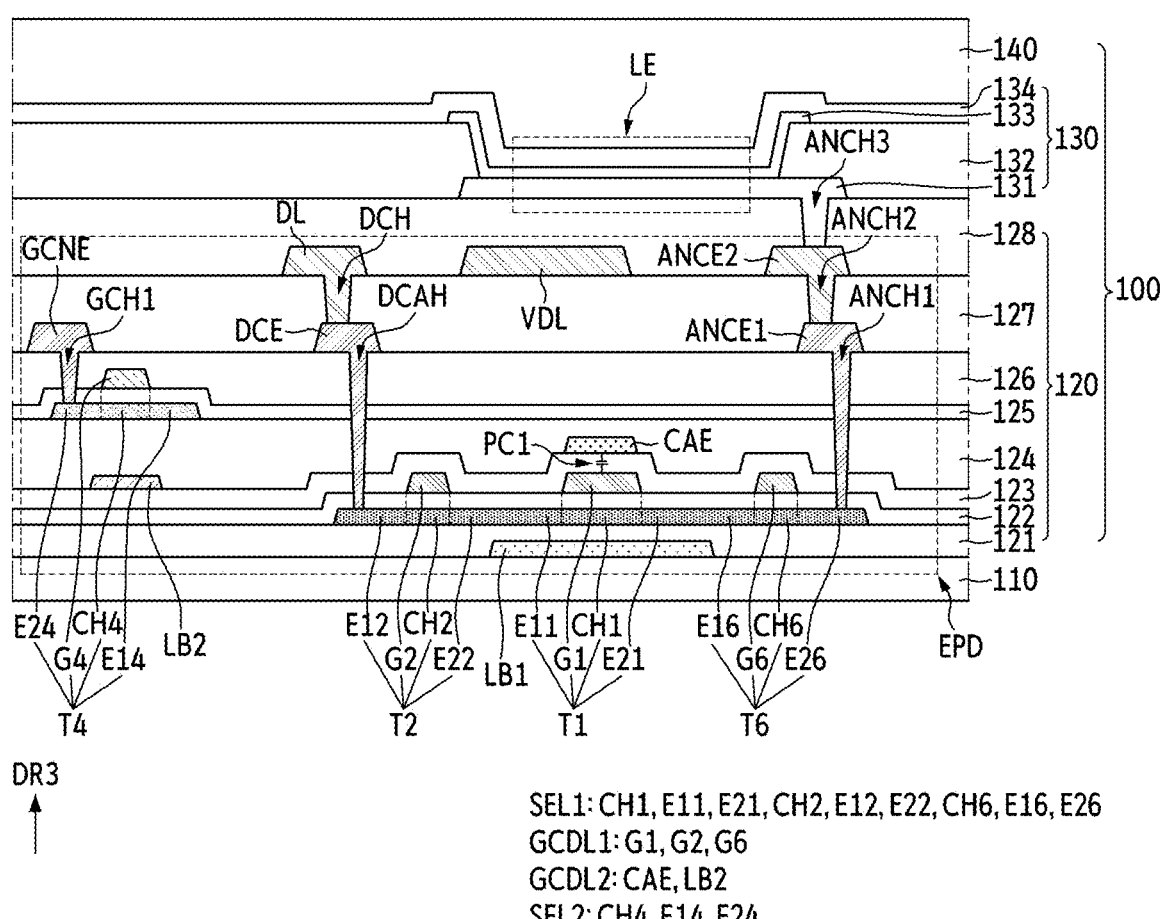
FIG. 9 is a cross-sectional view showing the first transistor, the second transistor, the fourth transistor, the sixth transistor, and the light emitting element of FIG. 8 according to an embodiment of the present disclosure.

FIG. 9 is a cross-sectional view showing the first transistor, the second transistor, the fourth transistor, the sixth transistor, and the light emitting element of FIG. 8.

Referring to FIG. 9, the circuit layer 120 may include the first semiconductor layer SEL1 disposed on the substrate 110, a first gate insulating layer 122 covering the first semiconductor layer SEL1, a first gate conductive layer GCDL1 disposed on the first gate insulating layer 122, a second gate insulating layer 123 covering the first gate conductive layer GCDL1, a second gate conductive layer GCDL2 disposed on the second gate insulating layer 123, a first interlayer insulating layer 124 covering the second gate conductive layer GCDL2, the second semiconductor layer SEL2 disposed on the first interlayer insulating layer 124, a third gate insulating layer 125 covering the second semiconductor layer SEL2, a third gate conductive layer GCDL3 disposed on the third gate insulating layer 125, a second interlayer insulating layer 126 covering the third gate conductive layer GCDL3, a first source-drain conductive layer SDCDL1 disposed on the second interlayer insulating layer 126, a first planarization layer 127 covering the first source-drain conductive layer SDCDL1, a second source-drain conductive layer SDCDL2 disposed on the first planarization layer 127, and a second planarization layer 128 covering the second source-drain conductive layer SDCDL2.

The circuit layer 120 may further include a first light blocking layer LB1 disposed on the substrate 110 and a buffer layer 121 covering the first light blocking layer LB1. The first semiconductor layer SEL1 may be disposed on the buffer layer 121. In an embodiment, the first semiconductor layer SEL1 may be disposed between the first gate insulating layer 122 and the buffer layer 121, and a portion of the 121 may be disposed in a space between the first light blocking layer LB1 and the first semiconductor layer SEL1.

In the light emitting pixel drivers EPD, the channel portion, the first electrode portion, and the second electrode portion of each of the first transistor T1, the second transistor T2, the fifth transistor T5 (see FIG. 8), the sixth transistor T6, the seventh transistor T7 (see FIG. 8), and the eighth transistor T8 (see FIG. 8), which are provided as P-type MOSFETs, may be disposed in the first semiconductor layer SEL1, and the gate electrode of each of the first transistor T1, the second transistor T2, the fifth transistor T5 (see FIG. 8), the sixth transistor T6, the seventh transistor T7 (see FIG. 8), and the eighth transistor T8 (see FIG. 8) may be disposed in the first gate conductive layer GCDL1 or the second gate conductive layer GCDL2.

In the light emitting pixel drivers EPD, the channel portion, the first electrode portion, and the second electrode portion of each of the third transistor T3 (see FIG. 8) and the fourth transistor T4, which are provided as N-type MOSFETs, may be disposed in the second semiconductor layer SEL2, and the gate electrode of each of the third transistor T3 (see FIG. 8) and the fourth transistor T4 may be disposed in the third gate conductive layer GCDL3.

In each of the first transistor T1, the second transistor T2, the third transistor T3 (see FIG. 8), the fourth transistor T4, the fifth transistor T5, the sixth transistor T6, the seventh transistor T7, and the eighth transistor T8, the first electrode portion may be connected to one side of the channel portion, the second electrode portion may be connected to the other side of the channel portion, and the gate electrode may overlap the channel portion. The first electrode portion may correspond to the first electrode, and the second electrode portion may correspond to the second electrode.

As illustrated in FIG. 9, the first transistor T1 may include a channel portion CH1, a first electrode portion E11, and a second electrode portion E21 disposed in the first semiconductor layer SEL1 on the buffer layer 121, and a gate electrode G1 disposed in the first gate conductive layer GCDL1 on the first gate insulating layer 122.

The channel portion CH1 of the first transistor T1 may overlap the first light blocking layer LB1 on the substrate 110 and the gate electrode G1 of the first transistor T1.

The second transistor T2 may include a channel portion CH2, a first electrode portion E12, and a second electrode portion E22 disposed in the first semiconductor layer SEL1 on the buffer layer 121, and a gate electrode G2 disposed in the first gate conductive layer GCDL1 on the first gate insulating layer 122.

The channel portion CH2 of the second transistor T2 may overlap the gate electrode G2 of the second transistor T2.

The sixth transistor T6 may include a channel portion CH6, a first electrode portion E16, and a second electrode portion E26 disposed in the first semiconductor layer SEL1 on the buffer layer 121, and a gate electrode G6 disposed in the first gate conductive layer GCDL1 on the first gate insulating layer 122.

The channel portion CH6 of the sixth transistor T6 may overlap the gate electrode G6 of the sixth transistor T6.

The first electrode portion E12 of the second transistor T2 may be electrically connected to the data line DL through a data connection electrode DCE.

The data connection electrode DCE may be disposed in the first source-drain conductive layer SDCDL1 and may be disposed on the second interlayer insulating layer 126. The data connection electrode DCE may be electrically connected to the first electrode portion E12 of the second transistor T2 through a data connection auxiliary hole DCAH penetrating the second interlayer insulating layer 126, the third gate insulating layer 125, the first interlayer insulating layer 124, the second gate insulating layer 123, and the first gate insulating layer 122.

The data line DL may be disposed in the second source-drain conductive layer SDCDL2 and may be disposed on the first planarization layer 127. The data line DL may be electrically connected to the data connection electrode DCE through a data connection hole DCH penetrating the first planarization layer 127.

The second electrode portion E22 of the second transistor T2 may be connected to the first electrode portion E11 of the first transistor T1.

The second electrode portion E21 of the first transistor T1 may be connected to the first electrode portion E16 of the sixth transistor T6.

The second electrode portion E26 of the sixth transistor T6 may be electrically connected to the anode electrode 131 through a first anode connection electrode ANCE1 and a second anode connection electrode ANCE2.

The first anode connection electrode ANCE1 may be disposed in the first source-drain conductive layer SDCDL1 and may be disposed on the second interlayer insulating layer 126. The first anode connection electrode ANCE1 may be electrically connected to the second electrode portion E26 of the sixth transistor T6 through a first anode connection hole ANCH1 penetrating the second interlayer insulating layer 126, the third gate insulating layer 125, the first interlayer insulating layer 124, the second gate insulating layer 123, and the first gate insulating layer 122.

The second anode connection electrode ANCE2 may be disposed in the second source-drain conductive layer SDCDL2 and may be disposed on the first planarization layer 127. The second anode connection electrode ANCE2 may be electrically connected to the first anode connection electrode ANCE1 through a second anode connection hole ANCH2 penetrating the first planarization layer 127.

The anode electrode 131 may be disposed on the second planarization layer 128, and may be electrically connected to the second anode connection electrode ANCE2 through a third anode connection hole ANCH3 penetrating the second planarization layer 128.

The pixel capacitor PC1 may be provided by an overlapping area between the capacitor electrode CAE and the gate electrode G1 of the first transistor T1. For example, the pixel capacitor PC1 may include the capacitor electrode CAE and the gate electrode G1 of the first transistor T1, which serve as capacitor electrodes. The pixel capacitor PC1 may further include a portion of the second gate insulating layer 123 may be disposed between the capacitor electrode CAE and the first transistor T1. The portion of the second gate insulating layer 123 may serve as a dielectric layer of the pixel capacitor PC1.

The capacitor electrode CAE may be disposed in the second gate conductive layer GCDL2 and may be disposed on the second gate insulating layer 123.

The fourth transistor T4 may include a channel portion CH4, a first electrode portion E14, and a second electrode portion E24 disposed in the second semiconductor layer SEL2, and the channel portion CH4, the first electrode portion E14, and the second electrode portion E24 may be disposed on the first interlayer insulating layer 124. The fourth transistor T4 may further include a gate electrode G4 disposed in the third gate conductive layer GCDL3. The gate electrode G4 may be disposed on the third gate insulating layer 125.

The channel portion CH4 of the fourth transistor T4 may overlap a second light blocking layer LB2 and the gate electrode G4 of the fourth transistor T4.

The second light blocking layer LB2 may be disposed in the second gate conductive layer GCDL2 on the second gate insulating layer 123. For example, the second light blocking layer LB2 may be disposed in a space between the third gate insulating layer 125 and the first interlayer insulating layer 124.

The second electrode portion E24 of the fourth transistor T4 may be electrically connected to the gate electrode G1 of the first transistor T1 through a gate connection electrode GCNE.

The gate connection electrode GCNE may be disposed in the first source-drain conductive layer SDCDL1 and may be disposed on the second interlayer insulating layer 126.

The gate connection electrode GCNE may be electrically connected to the second electrode portion E24 of the fourth transistor T4 through a gate connection hole GCH1 penetrating the second interlayer insulating layer 126 and the third gate insulating layer 125.

In an embodiment, the third transistor T3 has a structure similar to that of the fourth transistor T4, and the fifth transistor T5, the seventh transistor T7, and the eighth transistor T8 have structures similar to those of the second transistor T2 and the sixth transistor T6. Redundant description thereof will be omitted below.

The first power line VDL may be disposed in the second source-drain conductive layer SDCDL2 and may be disposed on the first planarization layer 127.

The element layer 130 may include the light emitting elements LE respectively disposed in the emission areas EA (see FIG. 6) on the circuit layer 120.

Each of the light emitting elements LE may include a structure in which a light emitting layer 133 is disposed between the anode electrode 131 and a cathode electrode 134 facing each other.

According to embodiments, the element layer 130 may include the anode electrodes 131 respectively disposed in the emission areas EA, a pixel defining layer 132 disposed in the non-emission area between the emission areas EA and covering the edge of the anode electrode 131, light emitting layers 133 respectively disposed on the anode electrodes 131, and the cathode electrode 134 disposed on the light emitting layers 133 and the pixel defining layer 132.

Each of the light emitting elements LE may further include first common layers disposed between the anode electrodes 131 and the light emitting layers 133, and a second common layer disposed between the light emitting layers 133 and the cathode electrode 134.

The encapsulation layer 140 may be disposed on the circuit layer 120 and cover the element layer 130.

The encapsulation layer 140 is to block the permeation of oxygen or moisture into the element layer 130 and to reduce electrical or physical impact to the circuit layer 120 and the element layer 130.

The encapsulation layer 140 may include a first encapsulation layer disposed on the element layer 130 and containing an inorganic insulating material, a second encapsulation layer disposed on the first encapsulation layer and containing an organic insulating material, and a third encapsulation layer covering the second encapsulation layer and containing an inorganic insulating material.

Figure 10:
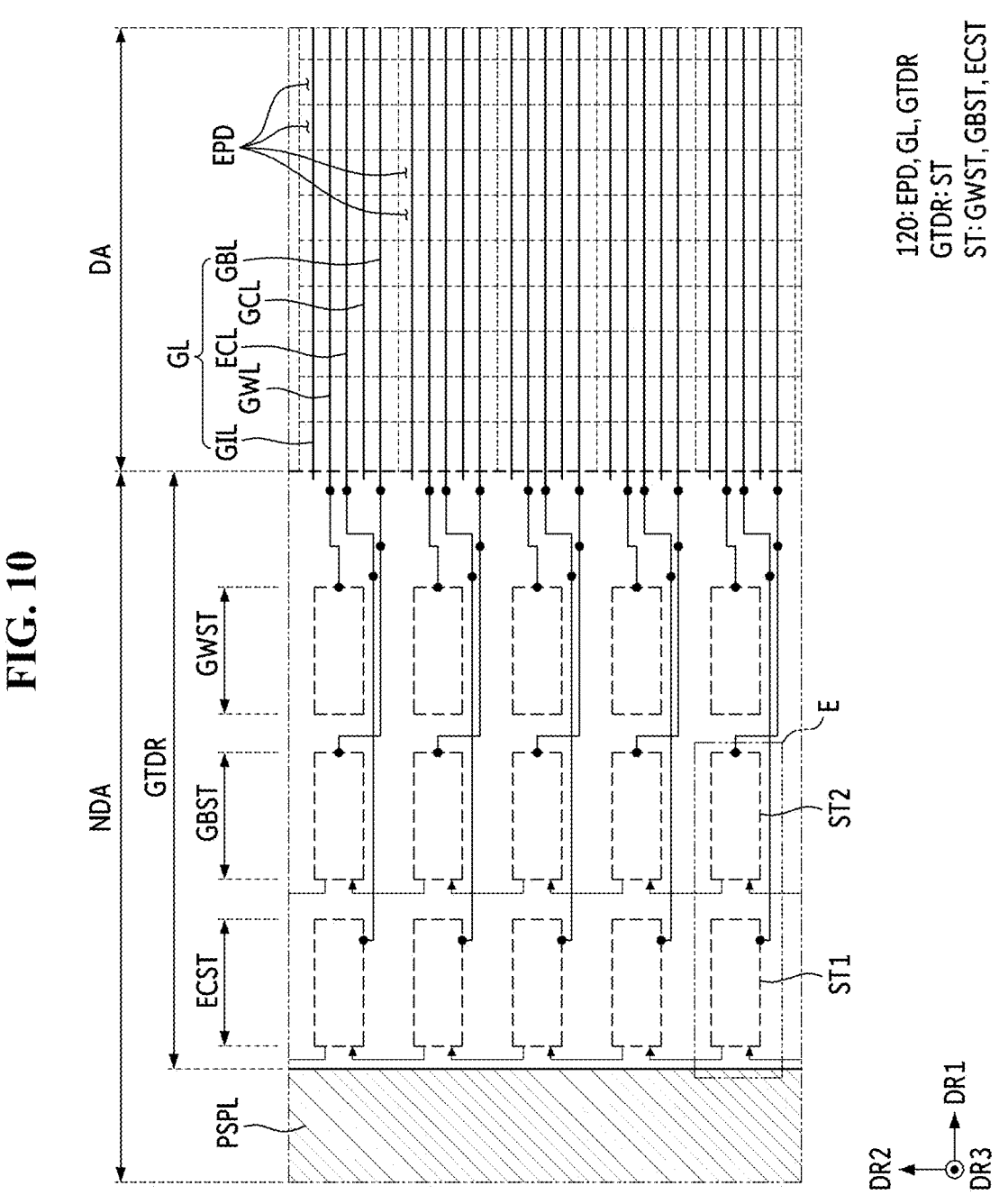
FIG. 10 is a layout diagram showing part C of FIG. 4 according to an embodiment of the present disclosure.
Figure 11:
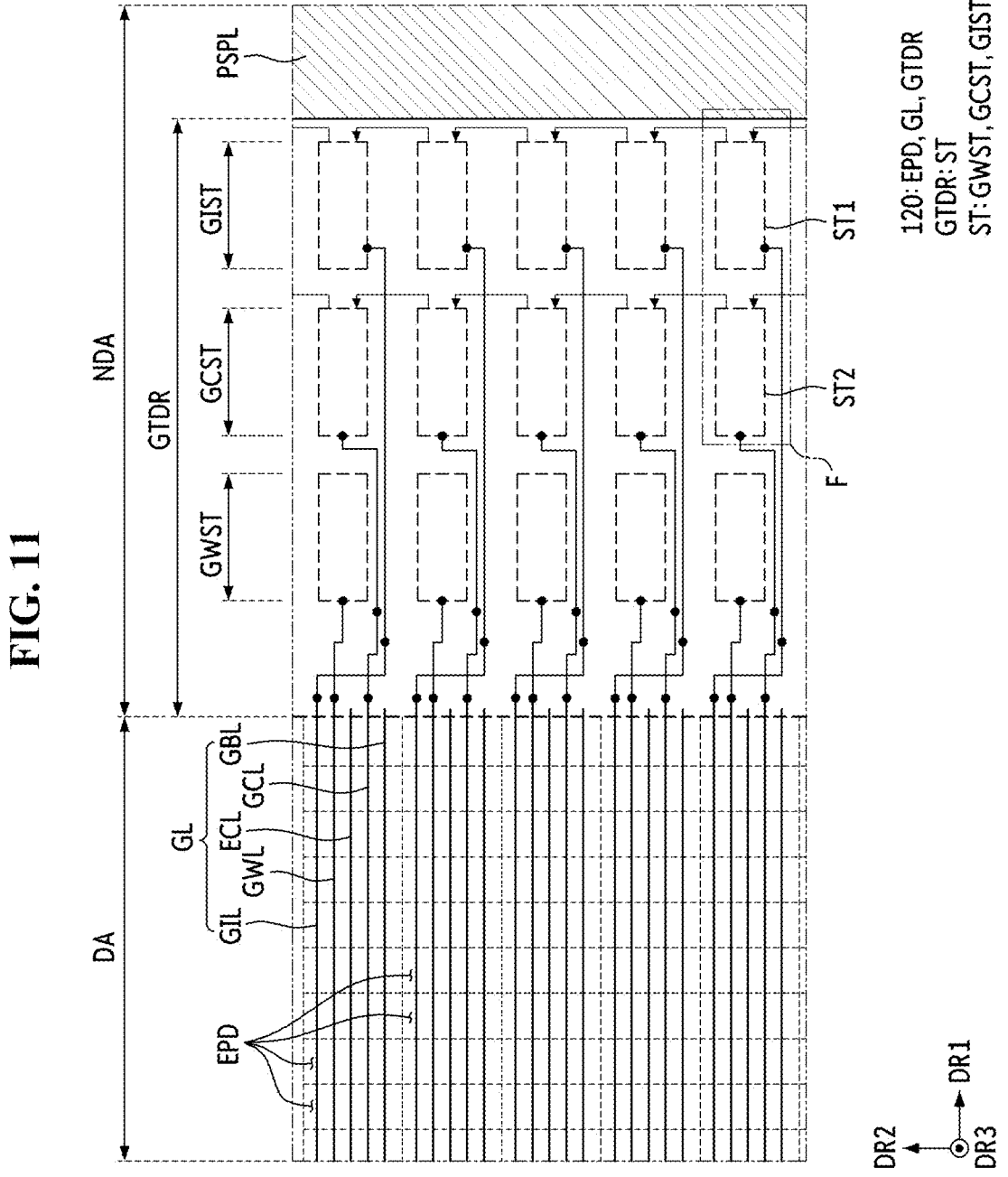
FIG. 11 is a layout diagram showing part D of FIG. 4 according to an embodiment of the present disclosure.

FIG. 10 is a layout diagram showing part C of FIG. 4 according to one embodiment. FIG. 11 is a layout diagram showing part D of FIG. 4 according to one embodiment.

Referring to FIGS. 10 and 11, the circuit layer 120 of the display device 100 according to one embodiment includes the light emitting pixel drivers EPD electrically connected to the light emitting elements LE (see FIG. 9) of the element layer 130 (see FIG. 9), the gate lines GL (i.e., a set of gate lines) that transmit gate signals to the light emitting pixel drivers EPD, and the gate driver GTDR that supplies the gate signals to the gate lines GL. For example, each of the light emitting pixel drivers EPD may be electrically connected to the set of gate lines.

Each of the gate lines GL may be electrically connected to a gate electrode of at least one of transistors T1 to T8 provided in each of the light emitting pixel drivers EPD.

For example, as illustrated in FIG. 8, the gate lines GL may include the scan write line GWL for transmitting the scan write signal GW, the scan initialization line GIL for transmitting the scan initialization signal GI, the emission control line ECL for transmitting the emission control signal EC, the gate control line GCL for transmitting the gate control signal GC, and the bias control line GBL for transmitting the bias control signal GB.

The scan write line GWL may be electrically connected to the gate electrode of the second transistor T2.

The scan initialization line GIL may be electrically connected to the gate electrode of the fourth transistor ST4.

The emission control line ECL may be electrically connected to the gate electrode of the fifth transistor T5 and the gate electrode of the sixth transistor T6.

The gate control line GCL may be electrically connected to the gate electrode of the third transistor T3.

The bias control line GBL may be electrically connected to the gate electrode of the seventh transistor T7 and the gate electrode of the eighth transistor T8.

The gate driver GTDR may include stages ST respectively electrically connected to the gate lines GL.

The stages ST may include scan write stages GWST (see FIGS. 10 and 11) electrically connected to the scan write lines GWL, scan initialization stages GIST (see FIG. 11) electrically connected to the scan initialization lines GIL, emission control stages ECST (see FIG. 10) electrically connected to the emission control lines ECL, gate control stages GCST (see FIG. 11) electrically connected to the gate control lines GCL, and bias control stages GBST (see FIG. 10) electrically connected to the bias control lines GBL. In an embodiment, the gate driver GTDR may include various drivers (i.e., various stages ST) supplying a set of driving signals (i.e., a set of gate signals) to a set of gate lines connected to a corresponding light emitting pixel driver EPD. For example, for a light emitting pixel driver EPD, the gate driver GRDR may include 1) a scan write stage GWST (i.e., a scan write signal driver) which is electrically connected to a scan write line GWL of the second transistor T2 of the light emitting pixel driver EPD, 2) a scan initialization stage GIST (i.e., a scan initialization signal driver) which is electrically connected to a scan initialization line GIL of the fourth transistor T4 of the light emitting pixel driver EPD, 3) an emission control stage ECST (i.e., an emission control signal driver) which is connected to an emission control line ECL of the fifth and sixth transistors T5 and T6 of the light emitting pixel driver EPD, 4) a gate control stage GCST (i.e., a gate control signal driver) which is connected to a gate control line GCL of the third transistor T3 of the light emitting pixel driver EPD, and 5) a bias control stage GBST (i.e., a bias control signal driver) which is connected to a bias control line GBL of the seventh and eight transistors T7 and T8.

According to one embodiment, the circuit layer 120 may further include a power supply line PSPL disposed in the non-display area NDA.

For example, the power supply line PSPL may extend along at least a part of the edge of the substrate 110.

The power supply line PSPL may transmit one of the first power ELVDD (see FIG. 8) and the second power ELVSS (see FIG. 8) for generating a driving current to be applied to the light emitting elements LE (see FIG. 8).

As an example, the power supply line PSPL may include a first power supply line transmitting the first power ELVDD, and a second power supply line transmitting the second power ELVSS.

In another example, the power supply line PSPL may be the second power supply line for transmitting the second power ELVSS, and the first power supply line for transmitting the first power ELVDD may be disposed in a portion of the non-display area NDA facing one side of the display area DA in the second direction DR2.

The gate driver GTDR may be disposed in the non-display area NDA.

According to one embodiment, the gate driver GTDR may be disposed in portions of the non-display area NDA facing both sides (e.g., opposite sides) of the display area DA in the first direction DR1.

In an embodiment, the gate driver GTDR may be disposed between the power supply line PSPL and the display area DA in the first direction DR1.

In one example, the gate driver GTDR may be disposed between one side of the display area DA and the power supply line PSPL in the first direction DR1.

In another example, some of the stages ST of the gate driver GTDR may be disposed between one side of the display area DA and the power supply line PSPL in the first direction DR1, and the remaining stages may be disposed between the other side of the display area DA and the power supply line PSPL in the first direction DR1.

For example, as shown in FIG. 10, the scan write stages GWST, the bias control stages GBST, and the emission control stages ECST among the stages ST of the gate driver GTDR may be disposed between one side of the display area DA and the power supply line PSPL in the first direction DR1.

The scan write stages GWST may face one side of the display area DA in the first direction DR1 and may be arranged parallel to each other in the second direction DR2.

The emission control stages ECST may be adjacent to the power supply line PSPL in the first direction DR1 and may be arranged parallel to each other in the second direction DR2.

The bias control stages GBST may be disposed between the scan write stages GWST and the emission control stages ECST in the first direction DR1 and may be arranged parallel to each other in the second direction DR2.

As shown in FIG. 11, the scan write stages GWST, the gate control stages GCST, and the scan initialization stages GIST among the stages ST of the gate driver GTDR may be disposed between the other side of the display area DA and the power supply line PSPL in the first direction DR1.

The scan write stages GWST may face the other side of the display area DA in the first direction DR1 and may be arranged parallel to each other in the second direction DR2.

The scan initialization stages GIST may be adjacent to the power supply line PSPL in the first direction DR1 and may be arranged parallel to each other in the second direction DR2.

The gate control stages GCST may be disposed between the scan write stages GWST and the scan initialization stages GIST in the first direction DR1 and may be arranged parallel to each other in the second direction DR2.

As shown in FIGS. 10 and 11, according to one embodiment, the gate driver GTDR may include a first stage ST1 (i.e., a first signal driver) electrically connected to one of the gate lines GL (i.e., one of the set of gate lines).

The gate driver GTDR may further include a second stage ST2 (i.e., a second signal driver) electrically connected to another of the gate lines GL (i.e., another gate line of the set of gate lines) and adjacent to the first stage ST1.

The first stage ST1 and the second stage ST2 may include the same circuit.

For example, among the stages ST of the gate driver GTDR, those other than the scan write stages GWST may be implemented with the same circuit.

For example, as shown in FIG. 10, the first stage ST1 may be one of the emission control stages ECST and the second stage ST2 may be one of the bias control stages GBST. In an embodiment, the first stage ST1 may be provided in plural. For example, the first stages ST1 may be arranged in the second direction DR2, and the first stages ST1 may include the same circuit such as the emission control stages ECST. In an embodiment, the second stage ST2 may be provided in plural. For example, the second stages ST2 may include the same circuit such as the bias control stages GBST.

Alternatively, as shown in FIG. 11, the first stage ST1 may be one of the scan initialization stages GIST, and the second stage ST2 may be one of the gate control stages GCST. In an embodiment, the first stage ST1 may be provided in plural. For example, the first stages ST1 may be arranged in the second direction DR2, and the first stages ST1 may include the same circuit such as the scan initialization stages GIST. In an embodiment, the second stage ST2 may be provided in plural. For example, the second stages ST2 may include the same circuit such as the gate control stages GCST.

Figure 12:
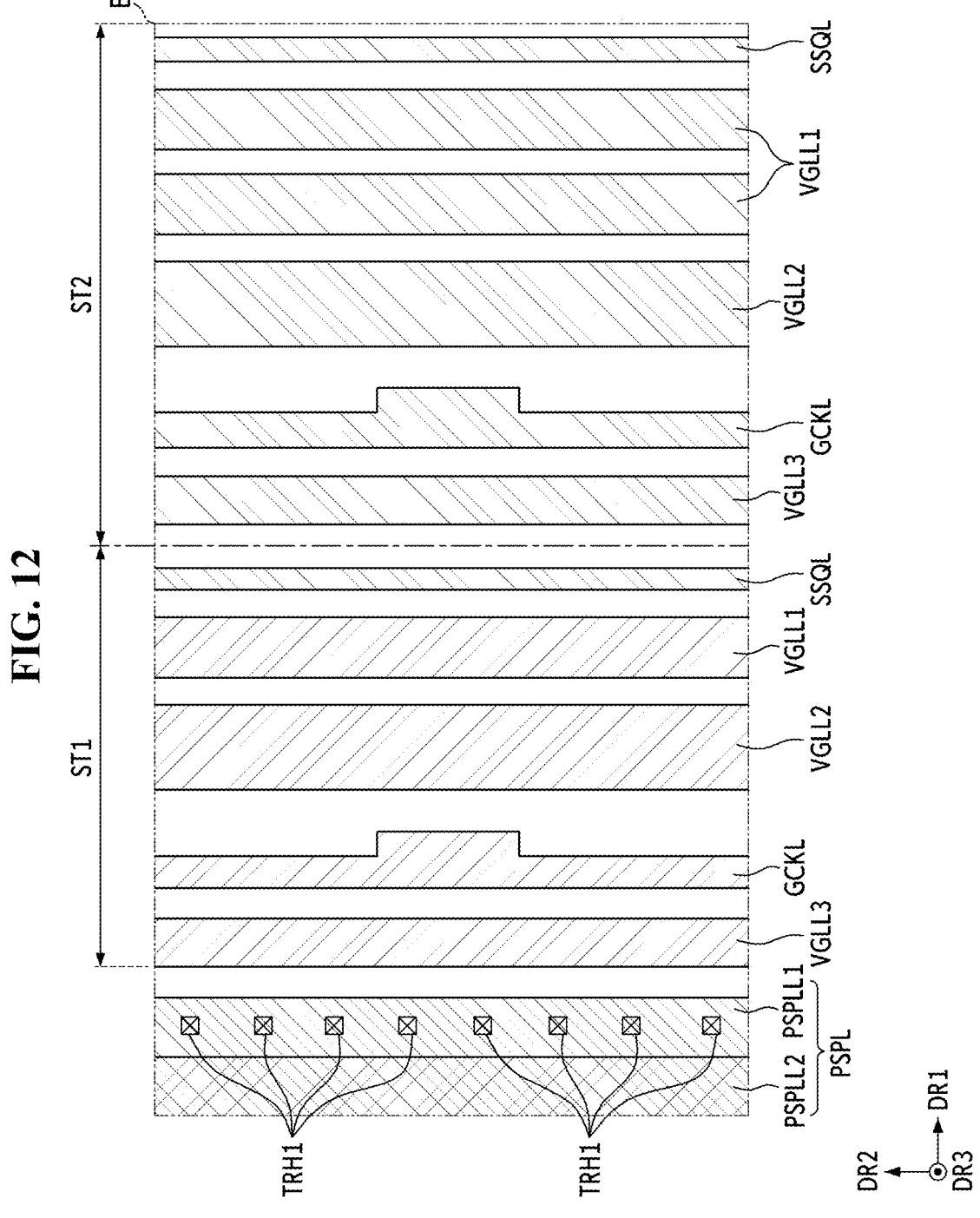
FIGS. 12 and 13 are layout diagrams showing part E of FIG. 10 and part F of FIG. 11 according to an embodiment of the present disclosure.
Figure 13:
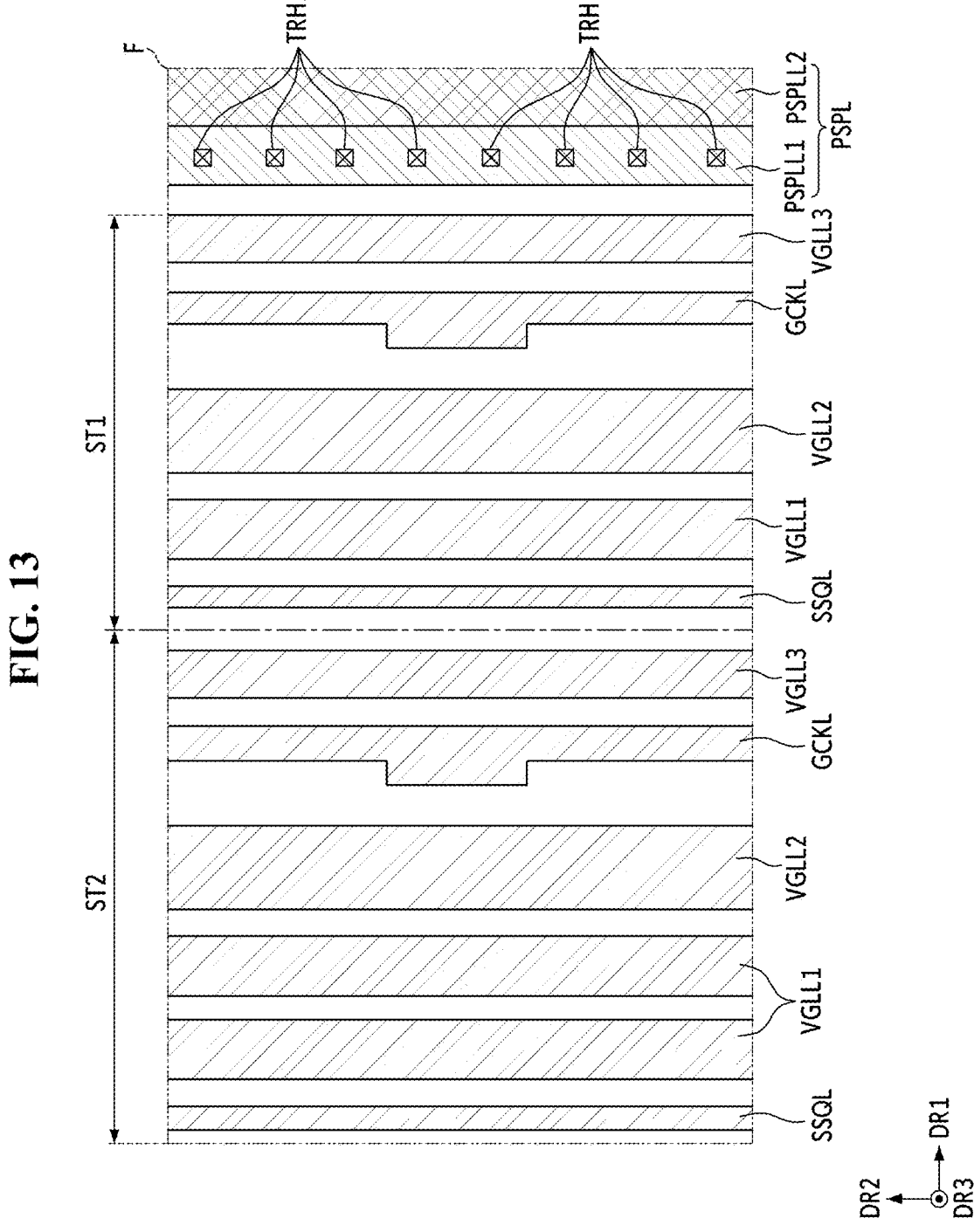

FIGS. 12 and 13 are layout diagrams showing part E of FIG. 10 and part F of FIG. 11 according to one embodiment.

According to one embodiment, each of the first stage ST1 and the second stage ST2 may be electrically connected to a first gate level voltage line VGLL1 for transmitting a first gate level voltage VGLV1 (see FIG. 20), a second gate level voltage line VGLL2 for transmitting a second gate level voltage VGLV2 (see FIG. 20), which is different from the first gate level voltage VGLV1, and a third gate level voltage line VGLL3 for transmitting a third gate level voltage VGLV3 (see FIG. 20), which is different from the first and second gate level voltages VGLV1 and VGLV2.

The first gate level voltage VGLV1 may have a higher voltage level than the second and third gate level voltages VGLV2 and VGLV3.

The gate signal of each of the first stage ST1 and the second stage ST2 may correspond to the first gate level voltage VGLV1 and the second gate level voltage VGLV2. For example, the gate signal of the first stage ST1 may have the first gate level voltage VGLV1, and the gate signal of the second stage ST2 may have the second gate level voltage VGLV2.

A stage sequence signal SSQ (see FIG. 20) may be transmitted from the stage in a previous column to the stage in a next column and may correspond to the first gate level voltage VGLV1 and the third gate level voltage VGLV3.

Each of the first stage ST1 and the second stage ST2 may output a gate signal to an output node OUT (see FIG. 20) based on the stage sequence signal SSQ (see FIG. 20) of a sequence transmission line SSQL and a gate clock signal sCLK (see FIG. 20) of a gate clock line GCKL.

The first stage ST1 and the second stage ST2 may be implemented with the same circuit.

According to one embodiment shown in FIGS. 12 and 13, the arrangement pattern of transistors of the first stage ST1 may be in a similar relationship with the arrangement pattern of transistors of the second stage ST2, with respect to the boundary between the first stage ST1 and the second stage ST2. For example, the transistors of the first stage ST1 and the transistors of the second stage ST2 may be similarly arranged.

Accordingly, the arrangement pattern of the wires (i.e., the first, second, and third gate level voltage lines VGLL1, VGLL2, and VGLL3, the sequence transmission line SSQL, and the gate clock line GCKL) electrically connected to the first stage ST1 may be in a similar relationship with the arrangement pattern of the wires electrically connected to the second stage ST2, with respect to the boundary between the first stage ST1 and the second stage ST2.

Figure 20:
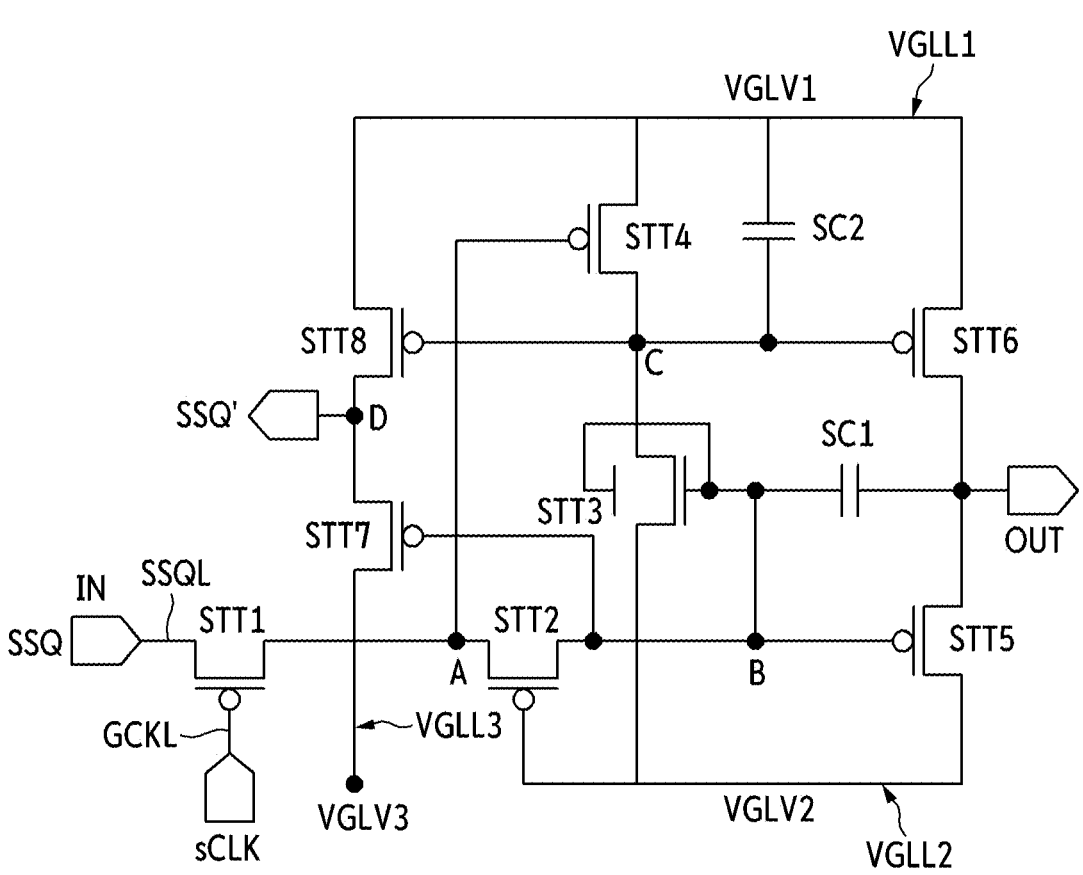
FIG. 20 is an equivalent circuit diagram illustrating a first stage according to an embodiment of the present disclosure.

Depending on the difference between the gate signal of the first stage ST1 and the gate signal of the second stage ST2, the width of the transistors (a fifth stage transistor STT5 and a sixth stage transistor STT6 in FIG. 20) of the first stage ST1 electrically connected to the output node OUT (see FIG. 20) may differ from the width of the transistors STT5 and STT6 of the second stage ST2 electrically connected to the output node OUT. The width of the transistors may refer to channel widths of the transistors, which may determine a current driving capability thereof. In an embodiment, the transistor STT5 of the second stage ST2 may have a wider channel than the transistors STT5 of the first stages ST1. For example, the transistor STT5 of the second stage ST2 may include two transistors STT5 of the first stage ST1 connected in parallel, and in the second stage ST2, two first gate level voltage lines VGLL1 may be connected to the two transistors connected in parallel, which correspond to the two transistors STT6 of the first stage ST2.

Accordingly, the first stage ST1 may intersect one first gate level voltage line VGLL1, and the second stage ST2 may intersect two first gate level voltage lines VGLL1. For example, in the first stage ST1, one first gate level voltage line VGLL1 may be connected to the transistor STT6, while in the second stage ST2, two first gate level voltage lines VGLL2 may be connected to the transistor STT6, which includes two transistors connected in parallel to increase the effective channel width. In an embodiment, a width, in the first direction DR1, of the first gate level voltage line VGLL1 in the first stage ST1 may be the same as a width, in the first direction DR1, of each of the two first gate level voltage lines VCLLI in the second stage ST2.

As shown in FIGS. 12 and 13, the circuit layer 120 of the display device 100 according to one embodiment may include first through holes TRH1 arranged around one side of the first stage ST1.

For example, as shown in FIG. 12, the first through holes TRH1 may be adjacent to the first stage ST1 on one side in the first direction DR1.

Alternatively, as shown in FIG. 13, the first through holes TRH1 may be adjacent to the first stage ST1 on the other side in the first direction DR1.

As shown in FIG. 9, the circuit layer 120 may include the first gate insulating layer 122 covering the first semiconductor layer SEL1 on the substrate 110, the second gate insulating layer 123 covering the first gate conductive layer GCDL1 on the first gate insulating layer 122, the first interlayer insulating layer 124 covering the second gate conductive layer GCDL2 on the second gate insulating layer 123, the third gate insulating layer 125 covering the second semiconductor layer SEL2 on the first interlayer insulating layer 124, and the second interlayer insulating layer 126 covering the third gate conductive layer GCDL3 on the third gate insulating layer 125.

Each of the first gate insulating layer 122, the second gate insulating layer 123, the first interlayer insulating layer 124, the third gate insulating layer 125, and the second interlayer insulating layer 126 may contain an inorganic insulating material such as silicon nitride and silicon oxide.

Figure 18:
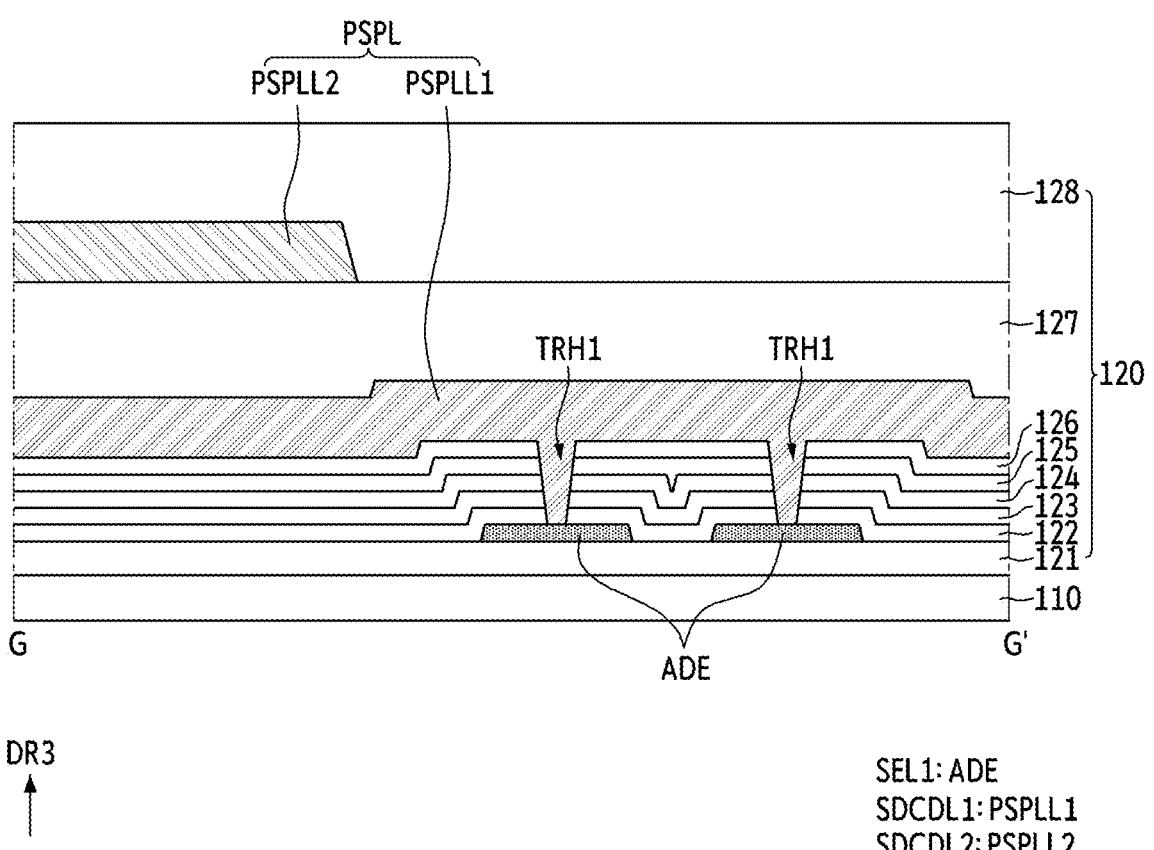
FIG. 18 is a cross-sectional view taken along line G-G' of FIG. 17 according to an embodiment of the present disclosure.

As shown in FIG. 18, each of the first through holes TRH1 may be disposed on the first semiconductor layer SEL1 and may penetrate the insulating layers containing an inorganic insulating material. For example, each of the first through holes TRH1 may penetrate the first gate insulating layer 122, the second gate insulating layer 123, the first interlayer insulating layer 124, the third gate insulating layer 125, and the second interlayer insulating layer 126.

Hydrogen (H) introduced into and remaining in the circuit layer 120 may be discharged relatively quickly and easily through the first through holes TRH1. For example, the first through holes TRH1 may serve to release hydrogen (H) that remains in the circuit layer 120. As a result, the influence of hydrogen on the characteristics of the transistors included in the first stage ST1 may be reduced. Since the output characteristics of the first stage ST1 may be maintained relatively uniformly, the display quality and lifespan of the display device 100 may be improved.

As shown in FIGS. 12 and 13, the circuit layer 120 of the display device 100 according to one embodiment may include the power supply line PSPL disposed in the non-display area NDA and transmitting one of the first power ELVDD (see FIG. 8) and the second power ELVSS (see FIG. 8).

The power supply line PSPL may be disposed in the first source-drain conductive layer SDCDL1 (see FIG. 9) on the second interlayer insulating layer 126 (see FIG. 9) or in the second source-drain conductive layer SDCDL2 (see FIG. 9) on the first planarization layer 127 (see FIG. 9).

For example, the power supply line PSPL may include a first line part PSPLL1 and a second line part PSPLL2 electrically connected to each other and overlapping each other.

The first line part PSPLL1 may be disposed in the first source-drain conductive layer SDCDL1 (see FIG. 9) on the second interlayer insulating layer 126 (see FIG. 9), and the second line part PSPLL2 may be disposed in the second source-drain conductive layer SDCDL2 (see FIG. 9) on the first planarization layer 127 (see FIG. 9).

According to one embodiment, the first through holes TRH1 may overlap the power supply line PSPL. For example, the first through holes TRH1 may overlap the first line part PSPLL1.

With the first through holes TRH1 overlapping the power supply line PSPL, an increase in the width of the non-display area NDA due to the placement of the first through holes TRH1 may be prevented.

Figure 19:
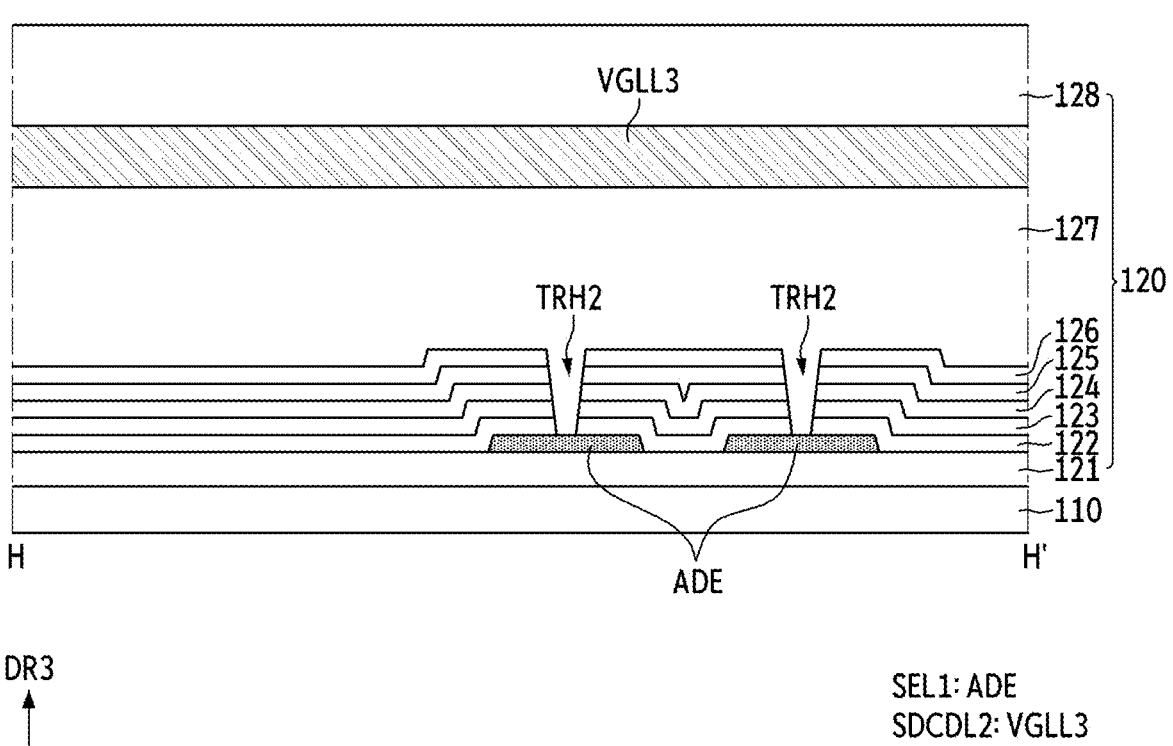
FIG. 19 is a cross-sectional view taken along line H-H' of FIG. 17 according to an embodiment of the present disclosure.

FIGS. 14, 15, 16 and 17 are layout diagrams showing part E of FIG. 10 according to respective embodiments. FIG. 18 is a cross-sectional view taken along line G-G' of FIG. 17. FIG. 19 is a cross-sectional view taken along line H-H' of FIG. 17.

Figure 14:
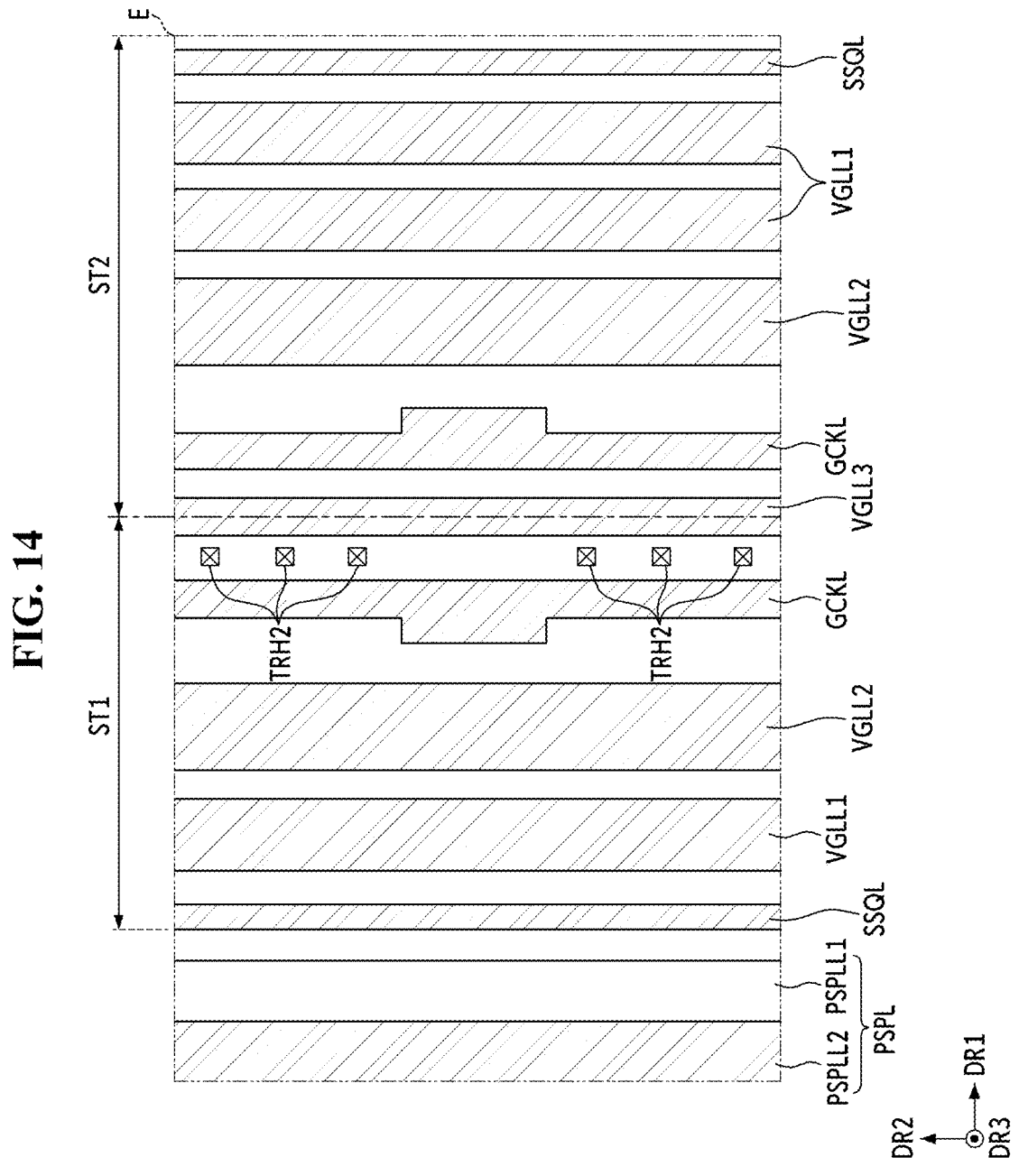
FIGS. 14, 15, 16 and 17 are layout diagrams showing part E of FIG. 10 according to respective embodiments of the present disclosure.

The display device 100 of one embodiment shown in FIG. 14 is substantially the same as the display device 100 of one embodiment shown in FIGS. 12 and 13, except that the circuit layer 120 further includes second through holes TRH2 arranged adjacent to the boundary between the first stage ST1 and the second stage ST2, and therefore, a redundant description will be omitted below.

According to one embodiment shown in FIG. 14, the arrangement pattern of transistors of the first stage ST1 may be in a symmetrical relationship with the arrangement pattern of transistors of the second stage ST2, with respect to the boundary between the first stage ST1 and the second stage ST2.

Accordingly, the arrangement pattern of the wires (i.e., the first, second, and third gate level voltage lines VGLL1, VGLL2, and VGLL3, the sequence transmission line SSQL, and the gate clock line GCKL) electrically connected to the first stage ST1 may be in a symmetrical relationship with the arrangement pattern of the wires electrically connected to the second stage ST2, with respect to the boundary between the first stage ST1 and the second stage ST2.

In an embodiment, at least one of the wires electrically connected to the first stage ST1 and the second stage ST2 may be shared by the first stage ST1 and the second stage ST2, and thus the width of the gate driver GTDR may be reduced.

For example, among the first, second, and third gate level voltage lines VGLL1, VGLL2, and VGLL3, the sequence transmission line SSQL, and the gate clock line GCKL, the third gate level voltage line VGLL3 may be disposed adjacent to the boundary between the first stage ST1 and the second stage ST2 and may be a shared line electrically connected to the first stage ST1 and the second stage ST2. For example, the third gate level voltage line VGLL3 may extend along the boundary between the first stage ST1 and the second stage ST2. The boundary therebetween may extend in the second direction DR2.

Alternatively, the gate clock line GCKL intersecting one of the first stage ST1 and the second stage ST2 may be a shared line electrically connected to the other of the first stage ST1 and the second stage ST2.

For example, the gate clock line GCKL intersecting the other of the first stage ST1 and the second stage ST2 may be a dummy line or may transmit the gate clock signal sCLK of the stages in another column.

As a result, in each of the first stage ST1 and the second stage ST2, most of the connection holes for electrical connection between the first source-drain conductive layer SDCDL1 and one of the first semiconductor layer SEL1 (see FIG. 9), the first gate conductive layer GCDL1 (see FIG. 9), the second gate conductive layer GCDL2 (see FIG. 9), the second semiconductor layer SEL2 (see FIG. 9), and the third gate conductive layer GCDL3 (see FIG. 9) may be disposed in a region far from the boundary between the first stage ST1 and the second stage ST2.

Since the residual amount of hydrogen (H) at the boundary between the first stage ST1 and the second stage ST2 becomes relatively large, the threshold voltage characteristics of the transistors may vary due to the hydrogen.

However, according to one embodiment of FIG. 14, since the circuit layer 120 includes the second through holes TRH2 arranged adjacent to the boundary between the first stage ST1 and the second stage ST2, the discharge of hydrogen may be relatively easily induced.

As shown in FIG. 19, similarly to the first through holes TRH1, each of the second through holes TRH2 may penetrate insulating layers disposed on the first semiconductor layer SEL1 and containing an inorganic insulating material. For example, each of the second through holes TRH2 may penetrate the first gate insulating layer 122, the second gate insulating layer 123, the first interlayer insulating layer 124, the third gate insulating layer 125, and the second interlayer insulating layer 126.

In an embodiment, at least one of the wires electrically connected to the first stage ST1 and the second stage ST2 may serve as a shared line due to the mutual symmetry of the first stage ST1 and the second stage ST2, thereby allowing the width of the gate driver GTDR to be reduced, while the residual amount of hydrogen (H) at the boundary between the first stage ST1 and the second stage ST2 may be reduced by the second through holes TRH2. Accordingly, since the output characteristics of the first stage ST1 and the second stage ST2, which are mutually symmetrical, may be maintained relatively uniformly, thereby improving the display quality and lifespan of the display device 100.

Figure 15:
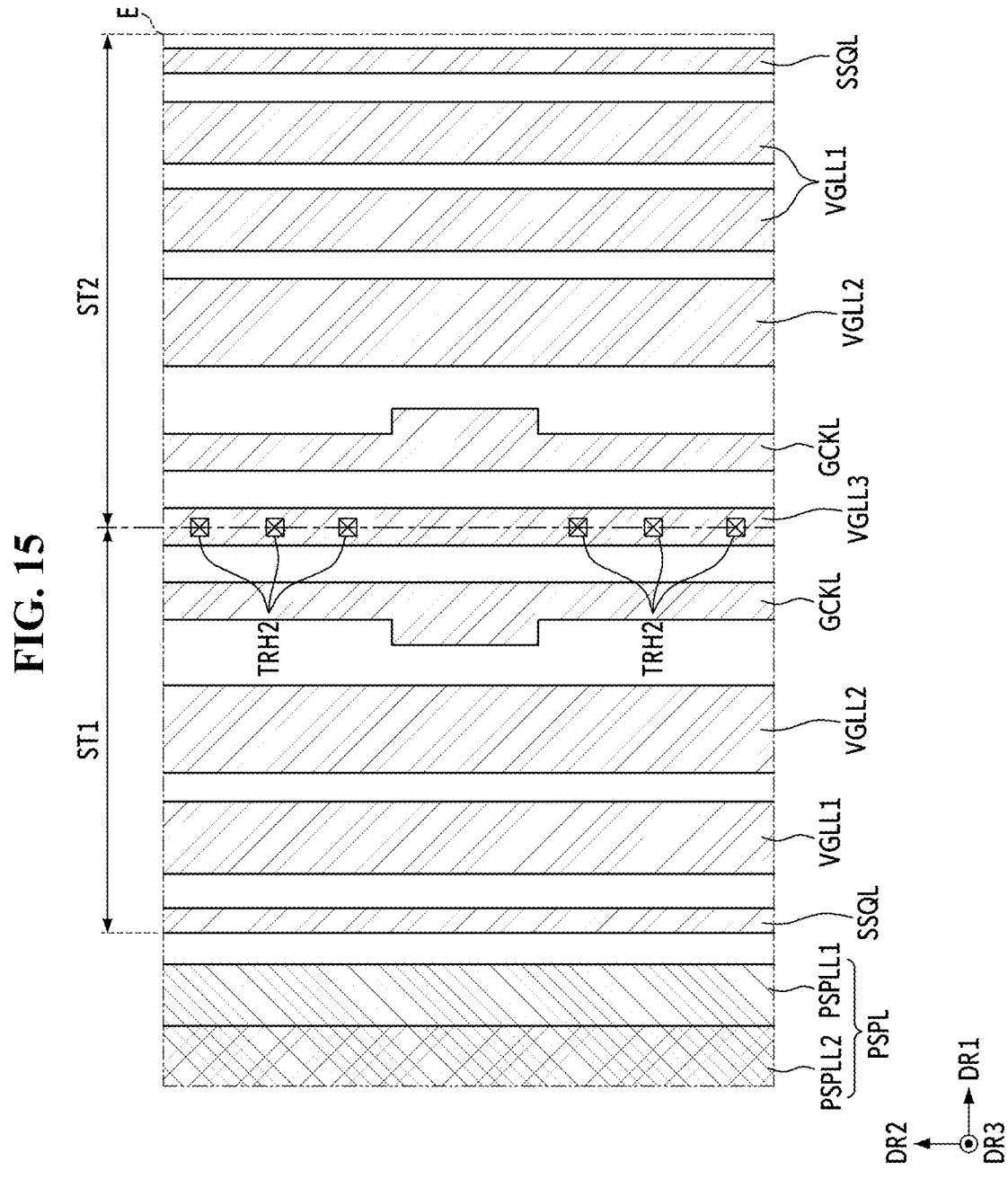

The display device 100 of one embodiment shown in FIG. 15 is substantially the same as the display device of one embodiment shown in FIG. 14, except that the second through holes TRH2 overlap at least one shared line VGLL3, and therefore, a redundant description will be omitted below.

With the second through holes overlapping the at least one shared line VGLL3, an increase in the width of the non-display area NDA due to the placement of the second through holes TRH2 may be prevented.

Figure 16:
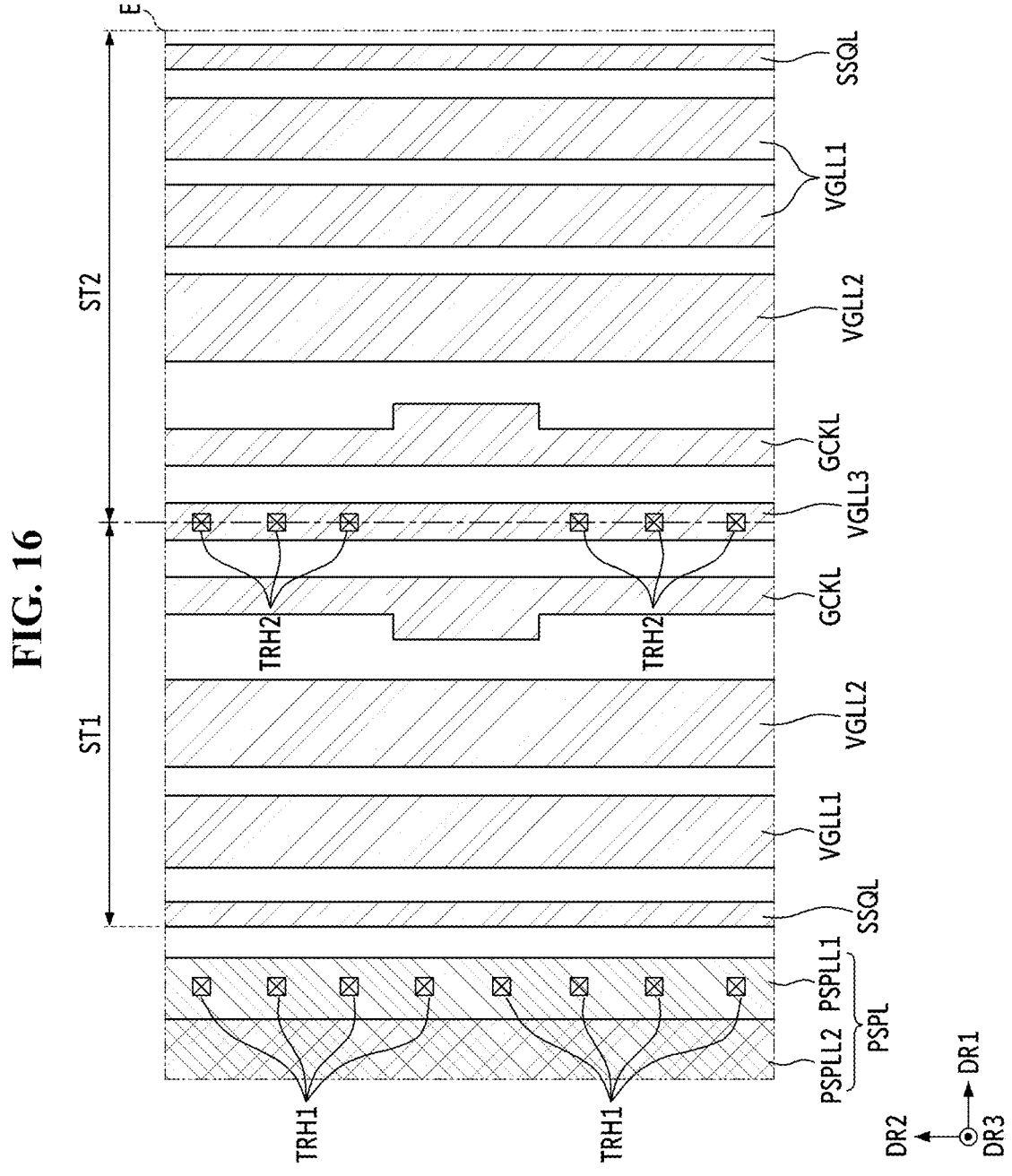

The display device 100 of one embodiment shown in FIG. 16 is substantially the same as the display device 100 of the embodiments shown in FIGS. 12, 13, 14, and 15, except that the circuit layer 120 includes both the first through holes TRH1 and the second through holes TRH2, and therefore, a redundant description will be omitted below.

Figure 17:
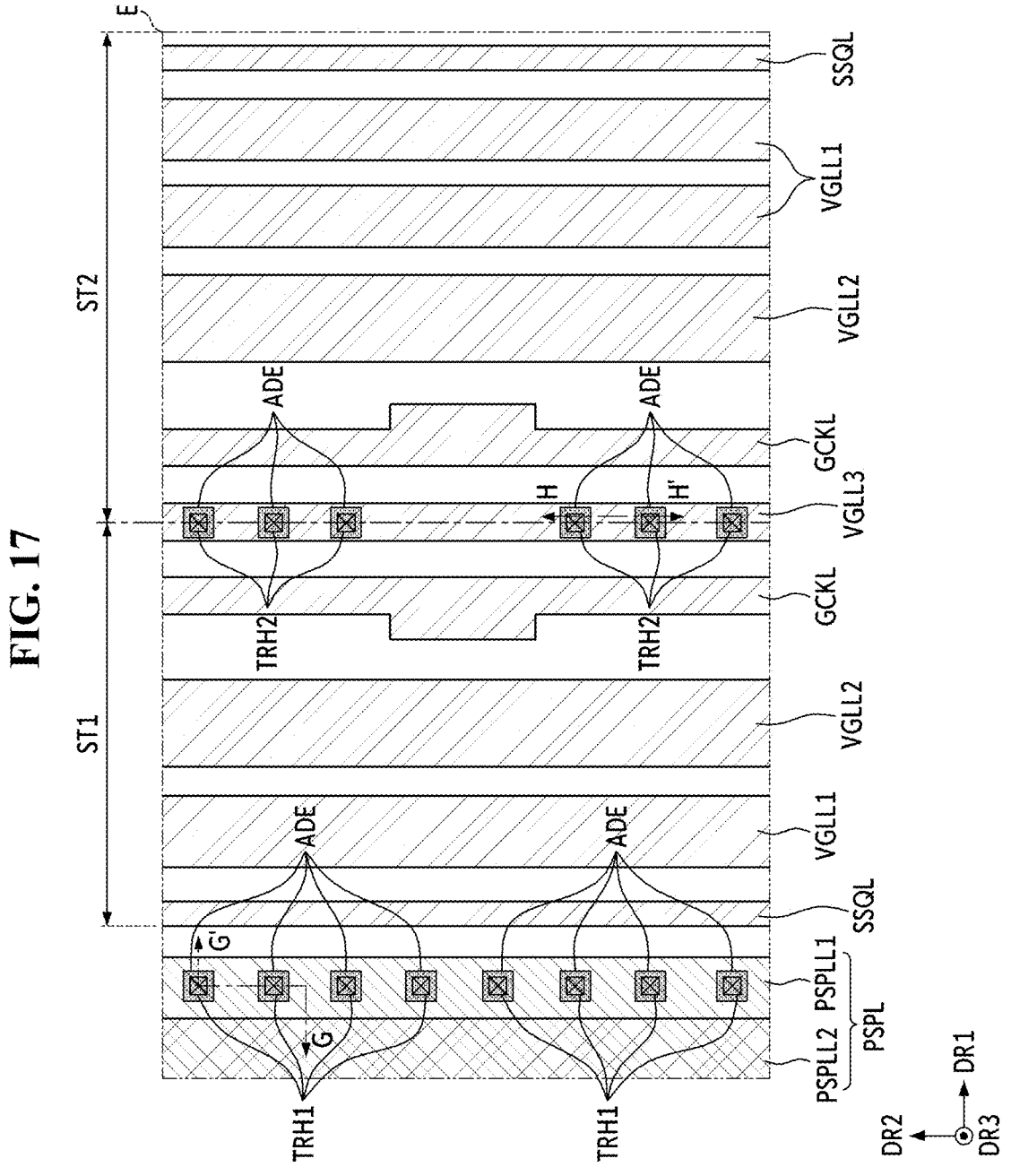

The display device 100 of one embodiment shown in FIG. 17 is substantially the same as the display device 100 of the embodiments shown in FIGS. 12, 13, 14, 15, and 16, except that the circuit layer 120 further includes additional electrodes ADE respectively overlapping at least some of the first through holes TRH1 and the second through holes TRH2, and therefore, a redundant description will be omitted below. In an embodiment, the additional electrodes ADE may be exposed by at least some of the first through holes TRH1 and the second through holes TRH2.

Each of the additional electrodes ADE may be disposed in an island shape in the first semiconductor layer SEL1 (see FIG. 9). In an embodiment, each of the additional electrodes ADE may be electrically floating. For example, each of the additional electrodes ADE are not connected to circuits of the circuit layer 120 such as the light emitting pixel drivers EPD and the gate driver, the ground, and the power supply line PSPL, either directly or through some reference potential.

At least some of the first through holes TRH1 and the second through holes TRH2 may respectively overlap the additional electrodes ADE. In an embodiment, the additional electrodes ADE may be exposed by at least some of the first through holes TRH1 and the second through holes TRH2.

For example, as shown in FIG. 15, each of the first through holes TRH1 may penetrate the first gate insulating layer 122, the second gate insulating layer 123, the first interlayer insulating layer 124, the third gate insulating layer 125, and the second interlayer insulating layer 126.

At least some of the first through holes TRH1 may respectively overlap the additional electrodes ADE disposed in the first semiconductor layer SEL1. In an embodiment, the additional electrodes ADE disposed in the first semiconductor layer SEL1 may be exposed by at least some of the first through holes TRH1.

In an embodiment, at least some of the first through holes TRH1 may respectively reach the additional electrodes ADE. For example, the first though holes TRH1 may include through holes each of which exposes a corresponding additional electrode of the additional electrodes ADE.

As shown in FIG. 19, each of the second through holes TRH2 may penetrate the first gate insulating layer 122, the second gate insulating layer 123, the first interlayer insulating layer 124, the third gate insulating layer 125, and the second interlayer insulating layer 126.

At least some of the second through holes TRH2 may respectively overlap the additional electrodes ADE disposed in the first semiconductor layer SEL1. In an embodiment, the additional electrodes ADE disposed in the first semiconductor layer SEL1 may be exposed by at least some of the second through holes TRH2.

In an embodiment, at least some of the second through holes TRH2 may respectively reach the additional electrodes ADE. For example, the second though holes TRH2 may include through holes each of which exposes a corresponding additional electrode of the additional electrodes ADE.

The additional electrodes ADE may function as an etching blocking layer (i.e., an etching blocking pattern), thereby preventing the first through holes TRH1 and the second through holes TRH2 from extending to the substrate 110. For example, damage to the substrate 110 caused during the formation of the first through holes TRH1 and the second through holes TRH2 may be prevented.

As shown in FIG. 18, the power supply line PSPL may include the first line part PSPLL1 disposed in the first source-drain conductive layer SDCDL1 and the second line part PSPLL2 disposed in the second source-drain conductive layer SDCDL2.

As shown in FIG. 19, the third gate level voltage line VGLL3 may be disposed in the second source-drain conductive layer SDCDL2.

The first and second gate level voltage lines VGLL1 and VGLL2, the sequence transmission line SSLQL, and the gate clock line GCKL may be disposed in the second source-drain conductive layer SDCDL2, similarly to the third gate level voltage line VGLL3.

Figure 21:
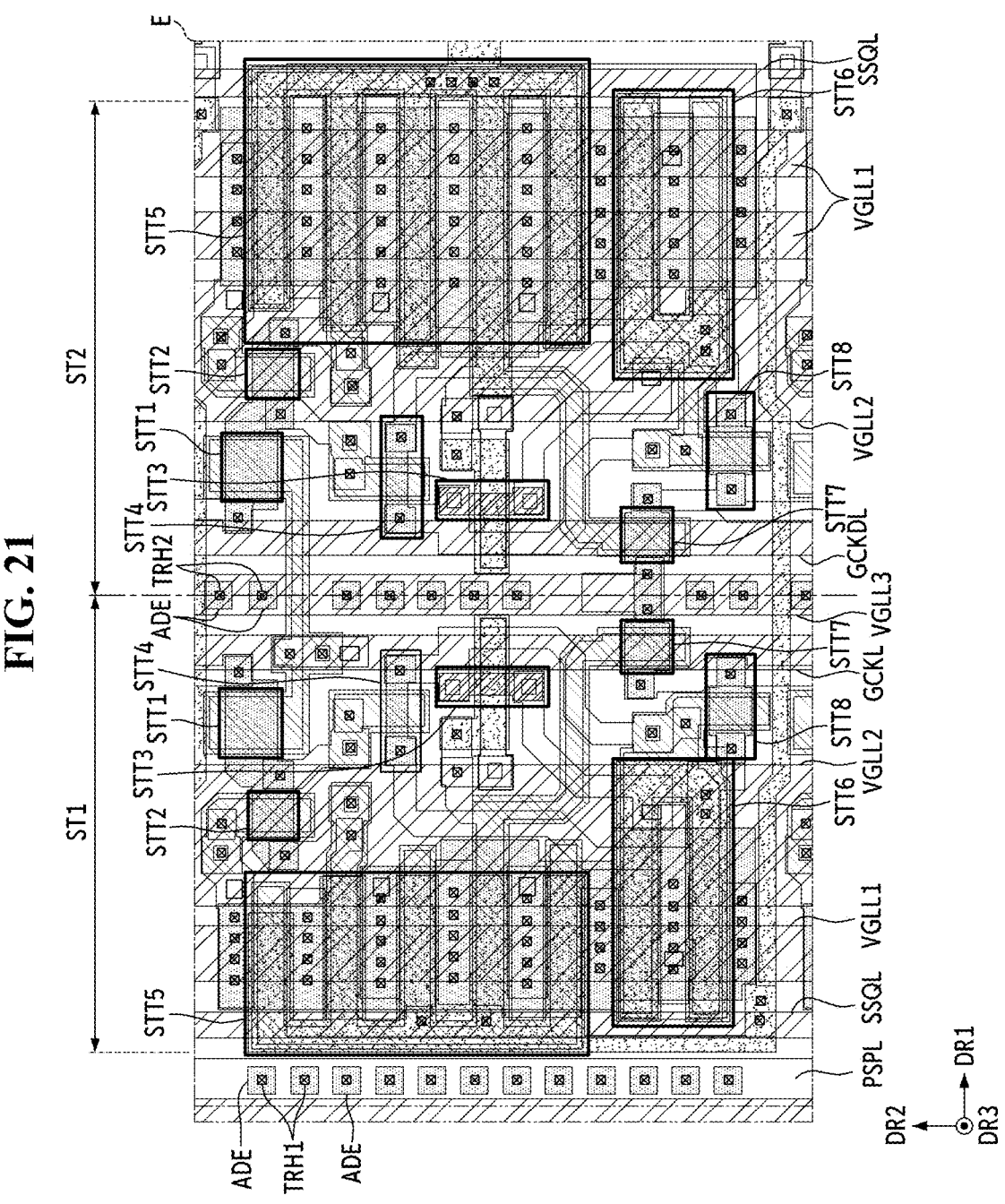
FIG. 21 is a plan view showing part E of FIG. 10 according to an embodiment of the present disclosure.

FIG. 20 is an equivalent circuit diagram illustrating a first stage according to one embodiment. FIG. 21 is a plan view showing part E of FIG. 10 which is implemented with embodiments of FIGS. 17 and 20.

Referring to FIG. 20, the first stage ST1 may be electrically connected to the first gate level voltage line VGLL1 for transmitting the first gate level voltage VGLV1, the second gate level voltage line VGLL2 for transmitting the second gate level voltage VGLV2, which is different from the first gate level voltage VGLV1, and the third gate level voltage line VGLL3 for transmitting the third gate level voltage VGLV3, which is different from the first and second gate level voltages VGLV1 and VGLV2.

The first stage ST1 may include a first stage transistor STT1 electrically connected between the sequence transmission line SSQL for transmitting the stage sequence signal SSQ and an A node A (i.e., a first node), and turned on in response to the gate clock signal sCLK of the gate clock line GCLK; a second stage transistor STT2 electrically connected between the A node A and a B node B (i.e., a second node), and turned on in response to the second gate level voltage VGLV2 of the second gate level voltage line VGLL2; a third stage transistor STT3 electrically connected between the second gate level voltage line VGLL2 and a C node C (i.e., a third node), and turned on in response to the potential of the B node B; a first stage capacitor SC1 electrically connected between the B node B and the output node OUT; a fourth stage transistor STT4 electrically connected between the first gate level voltage line VGLL1 and the C node C, and turned on in response to the potential of the A node A; a second stage capacitor SC2 electrically connected between the first gate level voltage line VGLL1 and the C node C; the fifth stage transistor STT5 electrically connected between the second gate level voltage line VGLL2 and the output node OUT, and turned on in response to the potential of the B node B; the sixth stage transistor STT6 electrically connected between the first gate level voltage line VGLL1 and the output node OUT, and turned on in response to the potential of the C node C; a seventh stage transistor STT7 electrically connected between the third gate level voltage line VGLL3 and a D node D (i.e., a fourth node), and turned on in response to the potential of the B node B; and an eighth stage transistor STT8 electrically connected between the first gate level voltage line VGLL1 and the D node D, and turned on in response to the potential of the C node C.

For example, in the first stage ST1, if the stage sequence signal SSQ is not transmitted to the A node A, the fifth stage transistor STT5 may be turned on in response to the potential of the B node B, and through the turned-on fifth stage transistor STT5, the output node OUT may be maintained at the second gate level voltage VGLV2.

The seventh stage transistor STT7 may be turned on in response to the potential of the B node B, and through the turned-on seventh stage transistor STT7, the D node D may be maintained at the third gate level voltage VGLV3.

When the stage sequence signal SSQ is transmitted to the first stage ST1 and the first stage transistor STT1 is turned on in response to the gate clock signal sCLK, the stage sequence signal SSQ is transmitted to the A node A, causing the fourth stage transistor STT4 to be turned on and the fifth stage transistor STT5 to be turned off. Then, through the turned-on fourth stage transistor STT4, the first gate level voltage VGLV1 may be transmitted to the C node C to turn on the sixth stage transistor STT6, and through the turned-on sixth stage transistor STT6, the output node OUT may output the gate signal of the first gate level voltage VGLV1.

The eighth stage transistor STT8 may be turned on in response to the potential of the C node C, and a stage sequence signal SSQ' of a next column may be outputted at the first gate level voltage VGLV1 through the D node D.

Among the first to eighth stage transistors STT1 to STT8 included in the first stage ST1, the third stage transistor STT3 may be provided as an N-type MOSFET, and the remaining transistors STT1, STT2, and STT4 to STT8 may be provided as P-type MOSFETs.

Since the second stage ST2 is implemented with the same circuit as the first stage ST1, a redundant description will be omitted below.

As shown in FIG. 21, the arrangement pattern of the first to eighth stage transistors STT1 to STT8 included in the first stage ST1 may be in a line-symmetric relationship with the arrangement pattern of the first to eighth stage transistors STT1 to STT8 included in the second stage ST2, with respect to the boundary between the first stage ST1 and the second stage ST2.

Accordingly, in each of the first stage ST1 and the second stage ST2, the fifth and sixth stage transistors STT5 and STT6 electrically connected to the output node OUT are spaced far from the boundary between the first stage ST1 and the second stage ST2. Accordingly, in each of the first stage ST1 and the second stage ST2, most of the connection holes for electrical connection may be disposed relatively far from the boundary between the first stage ST1 and the second stage ST2.

Accordingly, in one embodiment, in order to induce relatively quick and easy discharge of hydrogen, the second through holes TRH2, which replace the connection holes, may be disposed at the boundary between the first stage ST1 and the second stage ST2. As a result, the influence of hydrogen on the output characteristics of the first stage ST1 and the second stage ST2 may be reduced, thereby improving the display quality and lifespan of the display device 100.

According to one embodiment, the influence of hydrogen on the first stage ST1 may be reduced by the first through holes TRH1. Accordingly, the display quality and lifespan of the display device 100 may be improved.

According to one embodiment, the third gate level voltage line VGLL3 for transmitting the third gate level voltage VGLV3 (see FIG. 20) for forming the stage sequence signal SSQ may be disposed adjacent to the boundary between the first stage ST1 and the second stage ST2 and may serve as a shared line electrically connected to the first stage ST1 and the second stage ST2.

The second through holes TRH2 may be disposed adjacent to the boundary between the first stage ST1 and the second stage ST2 and may overlap the third gate level voltage line VGLL3.

The gate clock line GCKL for transmitting the gate clock signal sCLK (see FIG. 20) may intersect one (e.g., the first stage ST1) of the first stage ST1 and the second stage ST2.

A gate clock dummy line GCKDL, which intersects the other (e.g., the second stage ST2) of the first stage ST1 and the second stage ST2 and is symmetrical to the gate clock line GCKL, may be a dummy line for symmetrical arrangement of wires or may transmit the gate clock signal sCLK to the stage in another column.

The display device according to one embodiment of the present disclosure can be applied to various electronic devices. The electronic device according to the one embodiment of the present disclosure includes the display device described above, and may further include modules or devices having additional functions in addition to the display device.

Figure 22:
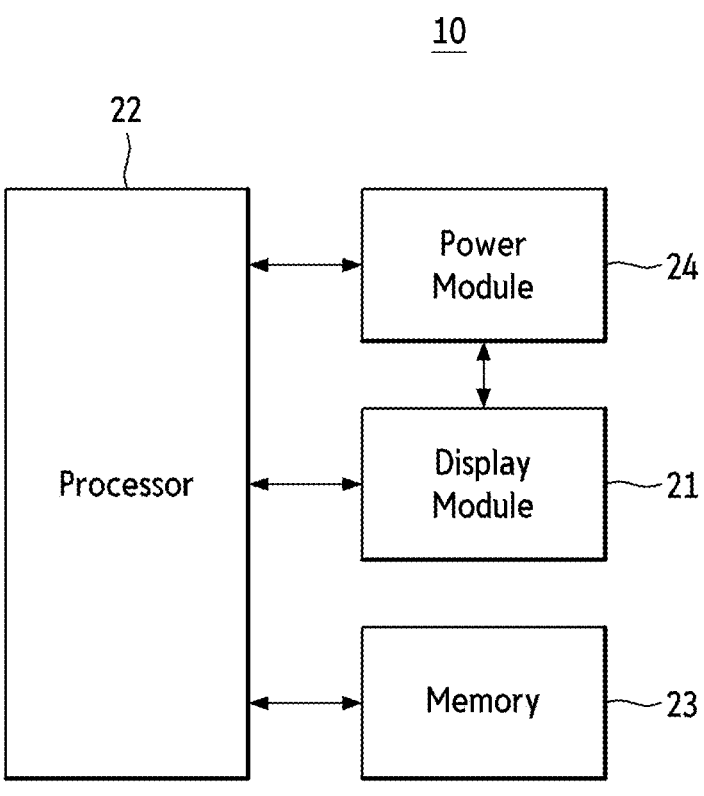
FIG. 22 is a block diagram of an electronic device according to an embodiment of the present disclosure.

FIG. 22 is a block diagram of an electronic device according to one embodiment of the present disclosure.

Referring to FIG. 22, the electronic device 1 according to one embodiment of the present disclosure may include a display module 11, a processor 12, a memory 13, and a power module 14.

The processor 12 may include at least one of a central processing unit (CPU), an application processor (AP), a graphic processing unit (GPU), a communication processor (CP), an image signal processor (ISP), and a controller.

The memory 15 may store data information necessary for the operation of the processor 12 or the display module 11. When the processor 12 executes an application stored in the memory 15, an image data signal and/or an input control signal is transmitted to the display module 11, and the display module 11 can process the received signal and output image information through a display screen.

The power module 14 may include a power supply module such as a power adapter and a battery, and a power conversion module that converts the power supplied by the power supply module to generate power necessary for the operation of the electronic device 1.

At least one of the components of the electronic device 11 according to the one embodiment of the present disclosure may be included in the display device 10 according to the embodiments of the present disclosure. In an embodiment, some modules of the individual modules functionally included in one module may be included in the display device 10, and other modules may be provided separately from the display device 10. For example, the display device 10 may include the display module 11, and the processor 12, the memory 13, and the power module 14 may be provided in the form of other devices within the electronic device 11 other than the display device 10.

Figure 23:
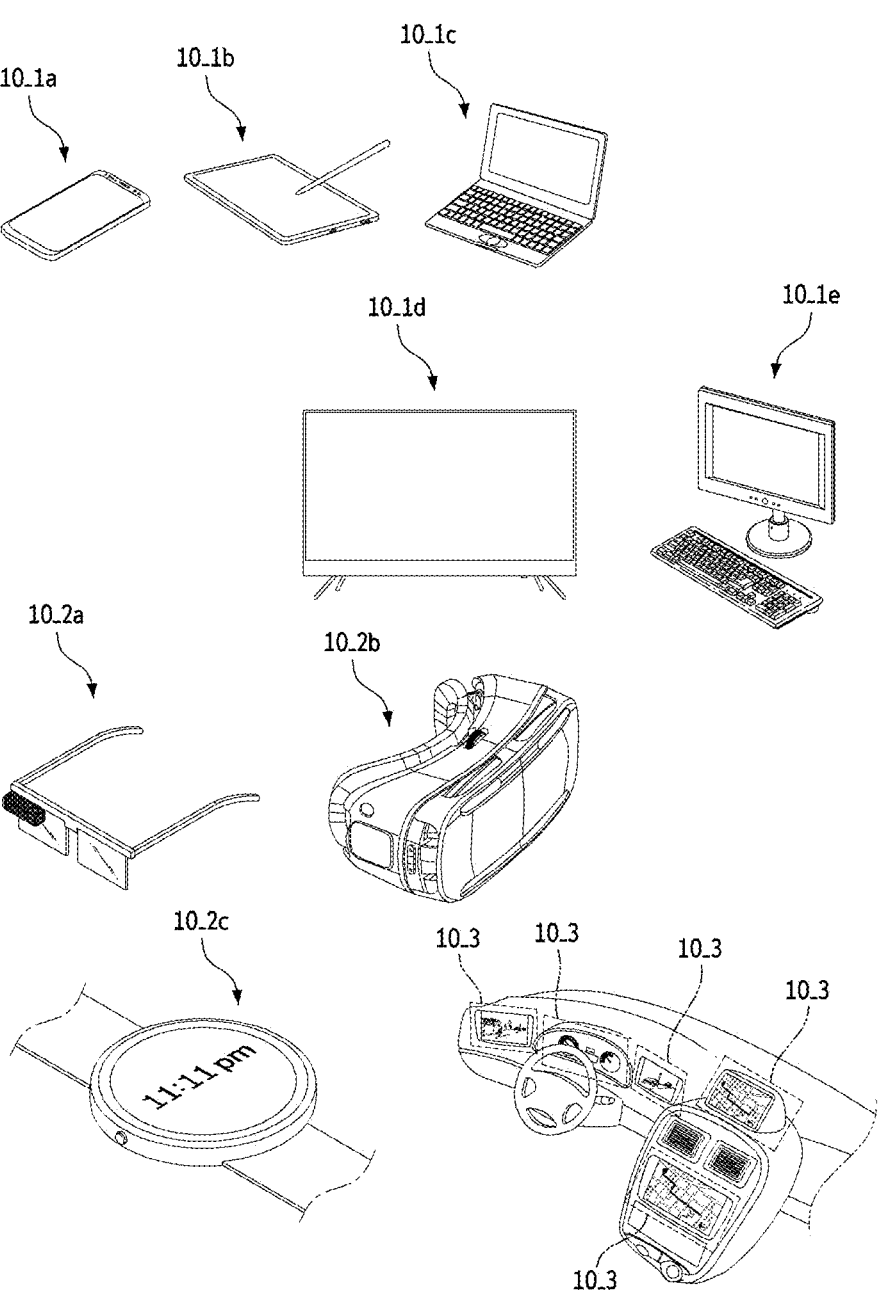
FIG. 23 is a schematic diagram of an electronic device according to various embodiments of the present disclosure.

FIG. 23 is a schematic diagram of an electronic device according to various embodiments of the present disclosure.

Referring to FIG. 23, various electronic devices to which display devices 10 according to embodiments of the present disclosure are applied may include not only image display electronic devices such as a smart phone 10_1a, a tablet PC (personal computer) 10_1b, a laptop 10_1c, a TV 10_1d, and a desk monitor 10_1e, but also wearable electronic devices including display modules such as smart glasses 10_2a, a head mounted display 10_2b, and a smart watch 10_2c, and vehicle electronic devices 10_3 including display modules such as a CID (Center Information Display) and a room mirror display arranged on a dashboard, center fascia, and dashboard of an automobile.

Figure 24:
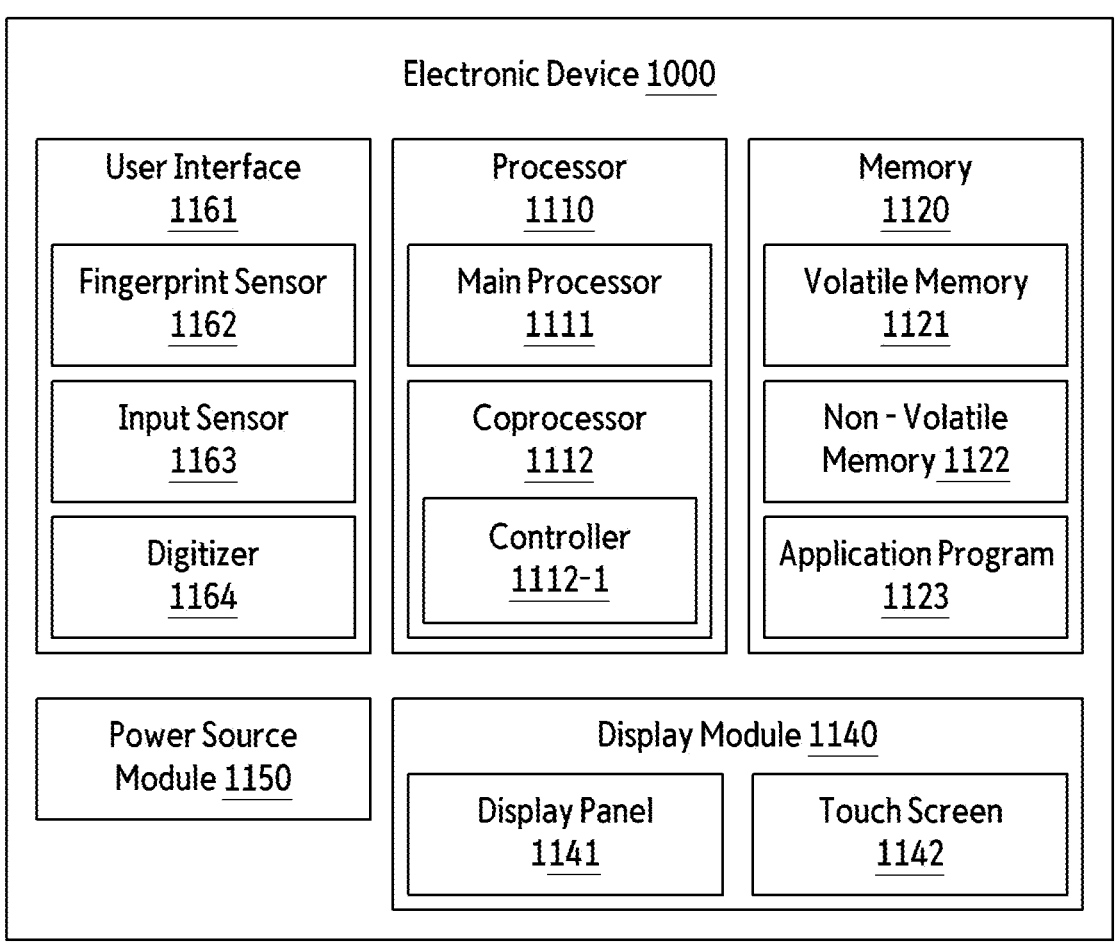
FIG. 24 is a diagram illustrating an electronic device according to an embodiment of the present disclosure.

FIG. 24 is a diagram illustrating an electronic device according to an embodiment of the present disclosure. Referring to FIG. 24, the electronic device 1000 according to one embodiment of the present invention may output various information (e.g., images, text, music, etc.) through a display module 1140, which, for example, may correspond to the display device shown in FIG. 1. When a processor 1110 executes an application stored in a memory 1120, the display module 1140 may provide application information to a user through a display panel 1141.

In some embodiments, the electronic device 1000 may be configured as a smartphone, camera, smart TV, monitor, smartwatch, tablet, automotive display, or AR/VR headset. For example, the electronic device 1000 may be a smartphone including a touch-sensitive display area DA for interaction and a non-display area NDA including sensors and circuits for enhanced functionality. For example, the electronic device 1000 may be a television or monitor including a large display area DA for high-resolution video playback and a non-display area NDA incorporating driving circuits or connectivity modules for external inputs. For example, the electronic device 1000 may be a smartwatch including a display area DA optimized for compact and high-clarity visuals and a non-display area NDA integrating biometric sensors for health monitoring. In some cases, the electronic device 1000 be an AR/VR headset.

In some embodiments, memory 1120 may store information such as software codes for operating an application program 1123. The application program 1123 may include a software designed to execute specific tasks or provide functionality to a user. The application program 1123 may operate under the control of the processor 1110 and utilizes data stored in the memory 1120 to deliver a wide range of features, such as productivity tools, multimedia streaming and playback, file or mail deliveries or communication services. The application program 1123 interacts seamlessly with the user interface 1161 or touch screen 1142, allowing a user to launch, navigate, and utilize the program through user inputs such as touch, tap, gesture, or voice interaction.

Upon user selection of an application via touch screen 1142 or user interface 1161, the processor 1110 may execute the application program 1123 corresponding to the selected application retrieved from the memory 1120 to perform functionalities of the application. For example, when a user selects a camera application by tapping the icon (or a camera application icon) presented on the display panel 1141, the processor 1110 activates a camera module. The processor 1110 may transmit image data corresponding to a captured image acquired through the camera module to the display module 1140. The display module 1140 may display an image corresponding to the captured image through the display panel 1141.

As another example, when a user wishes to make a phone call, the user taps the telephone icon displayed on the display module 1140, the processor 1110 may execute a phone application program stored in the memory 1120. A telephone keypad may be presented on the display panel 1141 for the user to enter a phone number to call.

As another example, the display module 1140 may be integrated into an electronic device 1000, such as a laptop computer, smart TV, or tablet. A user wishing to access a multimedia streaming application (e.g., to watch a music video or movie) can do so by tapping the corresponding icon. This action activates the application, allowing the user to view the streamed content.

The processor 1110 may include a main processor 1111 and an auxiliary or coprocessor 1112. The main processor 1111 may include a central processing unit (CPU). The main processor 1111 may further include one or more of a graphics processing unit (GPU), a communication processor (CP), and an image signal processor (ISP).

The coprocessor 1112 may include a controller 1112-1. The controller 1112-1 may include an interface conversion circuit and a timing control circuit. The controller 1112-1 may receive an image signal from the main processor 1111, convert the data format of the image signal to match the interface specifications with the display module 1140, and output image data. The controller 1112-1 may output various control signals to drive the display module 1140. For example, the controller 1112-1 may drive the display module 1140 to display the icon on the display screen suitable for selection by a user to cause execution of an application program 1123.

The memory 1120 may store one or more application programs 1123 and various data used by at least one component (for example, the processor 1110 or the user interface 1161) of the electronic device 1000 and input data or output data for commands related thereto. For example, a camera application program, a GPS application program, an augmented reality and virtual reality application program, and other application programs that can be executed by the processor 1110 upon selection of corresponding icons presented on the display screen (or display panel 1141) via the touch screen 1142 or user interface 1161 by the user. In addition, various setting data corresponding to user settings may be stored in the memory 1120. The memory 1120 may include volatile memory 1121 and non-volatile memory 1122.

The display module 1140 may output visual information (images) to the user. The display module 1140 may include the display panel 1141, a gate driver, the source driver, a voltage generation circuit, and a touch screen 1142. The display module 1140 may further include a window, a chassis, and a bracket to protect the display panel 1141. The display module 1140 may include at least a part of the configuration of the display device shown in FIG. 1.

The user interface 1161 serves as the interaction medium between a user and the electronic device 1000. The user interface 1161 may detect an input by a part (e.g., finger) of a user's body or an input by a pen or a mouse, and generate an electric signal or data value corresponding to the input. The user interface 1161 includes the fingerprint sensor 1162, the input sensor 1163, and a digitizer 1164.

The fingerprint sensor 1162 may sense a fingerprint for biometric recognition of the user and may also measure one or more biological signals such as blood pressure, moisture, or body mass.

The input sensor 1163 may sense user interactions including touch, tap, gesture, motion, spoken command, and eye movement. The input sensor 1163 includes optical sensors for image capture, eye tracking, or motion and gesture detection. Optical sensors may be infrared or semiconductor photodetectors. The input sensor 1163 includes audio and acoustic sensors, which may be MEMS microphones for voice recognition or sound-based interaction. The audio and acoustic sensors can be installed as part of the user interface 1161 or embedded in the display panel 1141.

The digitizer 1164 may generate a data value corresponding to coordinate information of input by a pen or a mouse to control movement of an onscreen cursor. The digitizer 1164 may generate the amount of change in electromagnetic due to the input as the data value. The digitizer may detect an input by a passive pen or transmit and receive data with an active pen or a remote.

At least one of the fingerprint sensor 1162, the input sensor 1163, or the digitizer 1164 may be implemented as a sensor layer formed on the top layer of the display panel 1141 through a continuous process with a process of forming elements (for example, the light emitting element, the transistor, and the like) included in the display panel 1141.

In addition, the user interface 1161 may further include, for example, a gesture sensor, a gyro sensor that senses rotational movements, an acceleration sensor to track translational movement, a grip sensor, a pressure sensor, a proximity sensor, a color sensor, an infrared (IR) emitter and camera sensor for tracking gaze direction and eye movements, a temperature sensor, or a light sensor. For example, the gyro sensor, acceleration sensor, and infrared emitter and camera may be particularly suitable for AR/VR headset functions.

The touch screen 1142 includes touch sensors embedded in semiconductor layers of the display panel 1141 to sense pressure applied to the top layer (screen) of the display panel 1141. The touch sensors can be a capacitive or a resistive type. The touch screen 1142 may serve as the primary interface for the user to select and navigate applications, control, and interact with the electronic device 1000.

The display panel 1141 (or display) may include a liquid crystal display panel, an organic light emitting display panel, or an inorganic light emitting display panel, and the type of the display panel 1141 is not particularly limited. The display panel 1141 may be of a rigid type or a flexible type that can be rolled or folded. The display module 1140 may further include a supporter, bracket, heat dissipation member, and the like that support the display panel 1141. The display panel 1141 may include the display unit shown in FIG. 1.

The power source module 1150 may supply power to the components of the electronic device 1000. The power source module 1150 may include a battery that charges the power source voltage. The battery may include a non-rechargeable primary battery or a rechargeable secondary battery or fuel cell. The power source module 1150 may include a power management integrated circuit (PMIC). The PMIC may supply optimized power source to each of the components described above including the display module 1140.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:
a substrate comprising a display area in which a plurality of emission areas are arranged and a non-display area arranged around the display area;
a circuit layer disposed on the substrate;
a plurality of light emitting elements disposed in the plurality of emission areas and disposed on the circuit layer,
wherein the circuit layer comprises:
  a light emitting pixel driver electrically connected to one of the plurality of light emitting elements;
  a set of gate lines connected to the light emitting pixel driver; and
  a gate driver supplying a set of gate signals to the set of gate lines, and
wherein the gate driver comprises a first signal driver electrically connected to one of the set of gate lines; and
a plurality of first through holes disposed in the circuit layer, wherein the plurality of first through holes, when viewed in a plan view, are adjacent to one side of a first region where the first signal driver is disposed.

2. The display device of claim 1, further comprising:
a plurality of second through holes disposed in the circuit layer,
wherein the plurality of second through holes, when viewed in the plan view, are adjacent to a boundary between the first region where the first signal driver is disposed and a second region where a second signal driver is disposed,
wherein the gate driver further comprises the second signal driver electrically connected to another gate line of the set of gate lines, and
wherein the first region and the second region are arranged in an extension direction of the set of gate lines.

3. The display device of claim 2,
wherein at least some of the plurality of first through holes and the plurality of second through holes exposes etching blocking patterns that are disposed in island shapes.

4. The display device of claim 2,
wherein the circuit layer further comprises a power supply line disposed in the non-display area, and
wherein a portion of the power supply line fills at least some of the plurality of first through holes.

5. The display device of claim 4,
wherein the power supply line transmits one of a first power and a second power for generating a driving current transmitted to the plurality of light emitting elements.

6. The display device of claim 4,
wherein at least a part of the second signal driver is symmetrical to the first signal driver with respect to the boundary between the first region and the second region,
wherein the gate driver comprises at least one shared line disposed adjacent to the boundary between the first region and the second region and electrically connected to the first signal driver and the second signal driver, and
wherein the at least one shared line overlaps at least a part of the plurality of second through holes.

7. The display device of claim 6,
wherein the circuit layer comprises:
a first semiconductor layer disposed on the substrate;
a first gate insulating layer covering the first semiconductor layer;
a first gate conductive layer disposed on the first gate insulating layer;
a second gate insulating layer covering the first gate conductive layer;
a second gate conductive layer disposed on the second gate insulating layer;
a first interlayer insulating layer covering the second gate conductive layer;
a second semiconductor layer disposed on the first interlayer insulating layer;
a third gate insulating layer covering the second semiconductor layer;
a third gate conductive layer disposed on the third gate insulating layer; and
a second interlayer insulating layer covering the third gate conductive layer,
wherein the second interlayer insulating layer, the third gate insulating layer, the first interlayer insulating layer, the second gate insulating layer and the first gate insulating layer each contain an inorganic insulating material, and wherein the plurality of first through holes and the plurality of second through holes each penetrate the second interlayer insulating layer, the third gate insulating layer, the first interlayer insulating layer, the second gate insulating layer and the first gate insulating layer.

8. The display device of claim 7,
wherein the circuit layer further comprises:
a first source-drain conductive layer disposed on the second interlayer insulating layer;
a first planarization layer covering the first source-drain conductive layer;
a second source-drain conductive layer disposed on the first planarization layer; and
a second planarization layer covering the second source-drain conductive layer,
wherein the power supply line is disposed in the first source-drain conductive layer or the second source-drain conductive layer.

9. The display device of claim 8,
wherein the at least one shared line is disposed in the first source-drain conductive layer or the second source-drain conductive layer.

10. The display device of claim 7,
wherein the set of gate lines comprise:
a scan write line transmitting a scan write signal;
a scan initialization line transmitting a scan initialization signal;
a gate control line transmitting a gate control signal;
an emission control line transmitting an emission control signal; and
a bias control line transmitting a bias control signal,
wherein the gate driver comprises:
a scan write signal driver electrically connected to the scan write line;
a scan initialization signal driver electrically connected to the scan initialization line;
a gate control signal driver electrically connected to the gate control line;
an emission control signal driver electrically connected to the emission control line; and
a bias control signal driver electrically connected to the bias control line,
wherein the first signal driver is one of the scan initialization signal driver, the gate control signal driver, the emission control signal driver and the bias control signal driver, and
wherein the second signal driver is another one of the scan initialization signal driver, the gate control signal driver, the emission control signal driver and the bias control signal driver.

11. The display device of claim 10,
wherein the scan write signal driver is adjacent to one side of the display area,
wherein the emission control signal driver is adjacent to the power supply line,
wherein the bias control signal driver is disposed between the scan write signal driver and the emission control signal driver,
wherein the first signal driver is the emission control signal driver, and
wherein the second signal driver is the bias control signal driver.

12. The display device of claim 10,
wherein the scan write signal driver is adjacent to one side of the display area,
wherein the scan initialization signal driver is adjacent to the power supply line, wherein the gate control signal driver is disposed between the scan write signal driver and the scan initialization signal driver,
wherein the first signal driver is the scan initialization signal driver, and
wherein the second signal driver is the gate control signal driver.

13. The display device of claim 10,
wherein the light emitting pixel driver comprises:
a first transistor electrically connected between a first node and a second node, wherein the first transistor turns on in response to a voltage of a third node;
a pixel capacitor electrically connected between the power supply line and the third node;
a second transistor electrically connected between a data line transmitting a data signal and the first node, wherein the second transistor turns on in response to the scan write signal;
a third transistor electrically connected between the second node and the third node, wherein the third transistor turns on in response to the gate control signal;
a fourth transistor electrically connected between a gate initialization voltage line transmitting a gate initialization voltage and the third node, wherein the fourth transistor turns on in response to the scan initialization signal;
a fifth transistor electrically connected between the power supply line and the first node, wherein the fifth transistor turns on in response to the emission control signal;
a sixth transistor electrically connected between the second node and a fourth node, wherein the sixth transistor turns on in response to the emission control signal;
a seventh transistor electrically connected between an anode initialization voltage line transmitting an anode initialization voltage and the fourth node, wherein the seventh transistor turns on in response to the bias control signal; and
an eighth transistor electrically connected between a bias voltage line transmitting a bias voltage and the first node, wherein the eighth transistor turns on in response to the bias control signal,
wherein the first node is electrically connected to a first electrode of the first transistor,
wherein the second node is electrically connected to a second electrode of the first transistor,
wherein the third node is electrically connected to a gate electrode of the first transistor,
wherein the fourth node is electrically connected to one of the plurality of light emitting elements,
wherein each of the first transistor, the second transistor, the fifth transistor, the sixth transistor, the seventh transistor and the eighth transistor comprises a channel portion, a first electrode portion and a second electrode portion disposed in the first semiconductor layer, and
wherein each of the third transistor and the fourth transistor comprises a channel portion, a first electrode portion, and a second electrode portion disposed in the second semiconductor layer.

14. The display device of claim 6,
wherein each of the first signal driver and the second signal driver is electrically connected to a first gate level voltage line transmitting a first gate level voltage, a second gate level voltage line transmitting a second gate level voltage different from the first gate level voltage, and a third gate level voltage line transmitting a third gate level voltage different from the first and second gate level voltages, wherein each of the first signal driver and the second signal driver comprises:

a first stage transistor electrically connected between a sequence transmission line transmitting a stage sequence signal and a first node, wherein the first stage transistor turns on in response to a gate clock signal;

a second stage transistor electrically connected between the first node and a second node, wherein the second stage transistor turns on in response to the second gate level voltage;

a third stage transistor electrically connected between the second gate level voltage line and a third node, wherein the third stage transistor turns on in response to a voltage of the second node;

a first stage capacitor electrically connected between the second node and an output node;

a fourth stage transistor electrically connected between the first gate level voltage line and the third node, wherein the fourth stage transistor turns on in response to a voltage of the first node;

a second stage capacitor electrically connected between the first gate level voltage line and the third node;

a fifth stage transistor electrically connected between the second gate level voltage line and the output node, wherein the fifth stage transistor turns on in response to the voltage of the second node;

a sixth stage transistor electrically connected between the first gate level voltage line and the output node, wherein the sixth stage transistor turns on in response to a voltage of the third node;

a seventh stage transistor electrically connected between the third gate level voltage line and a fourth node, wherein the seventh stage transistor turns on in response to the voltage of the second node; and an eighth stage transistor electrically connected between the first gate level voltage line and the fourth node, wherein on the eighth stage transistor turns on in response to the voltage of the third node, and wherein the at least one shared line comprises the third gate level voltage line.

15. The display device of claim 14, wherein the at least one shared line further comprises a stage sequence transmission line transmitting the stage sequence signal.

16. An electronic device comprising:

a display device displaying an image;

a lower cover disposed below the display device; and a cover window disposed on the display device, wherein the display device comprises:

a substrate comprising a display area in which a plurality of emission areas are arranged and a non-display area arranged around the display area;

a circuit layer disposed on the substrate; and a plurality of light emitting elements disposed in the plurality of emission areas and disposed on the circuit layer, wherein the circuit layer comprises:

a light emitting pixel driver electrically connected to one of the plurality of light emitting elements;

a set of gate lines connected to the light emitting pixel driver;

a gate driver supplying a set of gate signals to the set of gate lines; and a power supply line disposed in the non-display area, wherein the display device further comprises:

a display driving circuit supplying a data signal to the circuit layer; and a timing controller controlling a driving timing of each of the gate driver and the display driving circuit, wherein the gate driver comprises:

a first signal driver electrically connected to one of the set of gate lines; and a second signal driver electrically connected to another gate signal of the set of gate lines, wherein a first region where the first signal driver is disposed and a second region where the second signal driver is disposed are arranged in an extension direction of the set of gate lines, and wherein the circuit layer further comprises:

a plurality of first through holes adjacent to one side of the first region where the first signal driver is disposed, a portion of the power supply line filling the plurality of first through holes; and a plurality of second through holes adjacent to a boundary between the first region and the second region.

17. The electronic device of claim 16, further comprising:

a plurality of etching blocking patterns arranged in island shapes and disposed on the substrate, wherein at least some of the plurality of first through holes and the plurality of second through holes expose the plurality of etching blocking patterns.

18. The electronic device of claim 17, wherein at least a part of the second signal driver is symmetrical to the first signal driver with respect to the boundary between the first region and the second region, wherein the gate driver comprises at least one shared line disposed adjacent to the boundary between the first region and the second region and electrically connected to the first signal driver and the second signal driver, and wherein the at least one shared line overlaps at least a part of the plurality of second through holes.

19. The electronic device of claim 18, wherein the circuit layer comprises:

a first semiconductor layer disposed on the substrate;

a first gate insulating layer covering the first semiconductor layer;

a first gate conductive layer disposed on the first gate insulating layer;

a second gate insulating layer covering the first gate conductive layer;

a second gate conductive layer disposed on the second gate insulating layer;

a first interlayer insulating layer covering the second gate conductive layer;

a second semiconductor layer disposed on the first interlayer insulating layer;

a third gate insulating layer covering the second semiconductor layer;

a third gate conductive layer disposed on the third gate insulating layer; and a second interlayer insulating layer covering the third gate conductive layer, wherein the second interlayer insulating layer, the third gate insulating layer, the first interlayer insulating layer, the second gate insulating layer and the first gate insulating layer each contain an inorganic insulating material, and wherein the plurality of first through holes and the plurality of second through holes each penetrate the second interlayer insulating layer, the third gate insulating layer, the first interlayer insulating layer, the second gate insulating layer and the first gate insulating layer.

20. The electronic device of claim 19, wherein the circuit layer further comprises:

a first source-drain conductive layer disposed on the second interlayer insulating layer;

a first planarization layer covering the first source-drain conductive layer;

a second source-drain conductive layer disposed on the first planarization layer; and a second planarization layer covering the second source-drain conductive layer, wherein each of the power supply line and the at least one shared line is disposed in the first source-drain conductive layer or the second source-drain conductive layer.

\*　\*　\*　\*　\*